US012622271B2

(12) United States Patent
Wu et al.

(10) Patent No.: US 12,622,271 B2
(45) Date of Patent: May 5, 2026

(54) COOLING COVER AND PACKAGED SEMICONDUCTOR DEVICE INCLUDING THE SAME

(71) Applicant: Taiwan Semiconductor Manufacturing Co., Ltd., Hsinchu (TW)

(72) Inventors: Chung-Jung Wu, Hsinchu (TW); Sheng-Tsung Hsiao, Taoyuan (TW); Jen Yu Wang, Hsinchu (TW); Tung-Liang Shao, Hsinchu (TW); Chih-Hang Tung, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 566 days.

(21) Appl. No.: 17/809,128

(22) Filed: Jun. 27, 2022

(65) Prior Publication Data

US 2023/0420337 A1     Dec. 28, 2023

(51) Int. Cl.
H01L 23/367 (2006.01)
H01L 23/00 (2006.01)
(Continued)

(52) U.S. Cl.
CPC ........ *H01L 23/473* (2013.01); *H01L 23/4006* (2013.01); *H01L 25/0655* (2013.01); *H01L 2023/405* (2013.01); *H01L 2023/4087* (2013.01); *H01L 23/49833* (2013.01); *H01L 24/16* (2013.01); *H01L 24/32* (2013.01); *H01L 24/73* (2013.01); *H01L 24/96* (2013.01); *H01L 24/97* (2013.01); *H01L 2224/16227* (2013.01);

*H01L 2224/16238* (2013.01); *H01L 2224/32225* (2013.01); *H01L 2224/73204* (2013.01);
(Continued)

(58) Field of Classification Search
CPC .............. H01L 23/473; H01L 23/4006; H01L 25/0655; H01L 23/49833; H01L 24/16; H01L 24/32; H01L 24/73; H01L 24/96; H01L 24/97; H01L 2023/405; H01L 2023/4087; H01L 2224/16227; H01L 2224/16238; H01L 2224/32225; H01L 2224/73204; H01L 2924/1011; H01L 2924/10158; H01L 2924/15311
See application file for complete search history.

(56) References Cited

U.S. PATENT DOCUMENTS

| | | |
|---|---|---|
| 7,884,468 B2 | 2/2011 | Mann et al. |
| 7,999,375 B2 | 8/2011 | Hobbs et al. |

(Continued)

FOREIGN PATENT DOCUMENTS

| | | |
|---|---|---|
| CN | 101510534 A | 8/2009 |
| CN | 112447629 A | 3/2021 |

(Continued)

*Primary Examiner* — Dale E Page
*Assistant Examiner* — Cristian A Tivarus
(74) *Attorney, Agent, or Firm* — Slater Matsil, LLP

(57) ABSTRACT

Cooling covers including trapezoidal cooling chambers for cooling packaged semiconductor devices and methods of forming the same are disclosed. In an embodiment, a cooling cover for a semiconductor device includes an inlet; an outlet; and a cooling chamber in fluid communication with the inlet and the outlet, the cooling chamber having a trapezoidal shape in a cross-sectional view.

20 Claims, 26 Drawing Sheets

(51) Int. Cl.

| | | |
|---|---|---|
| *H01L 23/40* | (2006.01) | |
| *H01L 23/473* | (2006.01) | |
| *H01L 23/498* | (2006.01) | |
| *H01L 25/065* | (2023.01) | |

(52) U.S. Cl.
CPC ................. *H01L 2924/1011* (2013.01); *H01L 2924/10158* (2013.01); *H01L 2924/15311* (2013.01)

(56) References Cited

U.S. PATENT DOCUMENTS

| | | | | |
|---|---|---|---|---|
| 9,472,488 | B2 * | 10/2016 | Gohara ..................... | F28F 3/00 |
| 11,191,184 | B2 * | 11/2021 | Mizerak .............. | H01L 23/4006 |
| 2007/0242435 | A1 * | 10/2007 | Nakamura ......... | B60H 1/00392 |
| | | | | 257/E23.098 |
| 2009/0283902 | A1 * | 11/2009 | Bezama .............. | H01L 23/3675 |
| | | | | 257/713 |
| 2012/0097368 | A1 * | 4/2012 | Chen ....................... | F28F 13/08 |
| | | | | 165/104.21 |
| 2013/0207257 | A1 | 8/2013 | Sugaya | |
| 2018/0213677 | A1 | 7/2018 | Wu et al. | |
| 2018/0306531 | A1 * | 10/2018 | Kandlikar ............. | H01L 23/473 |
| 2020/0105644 | A1 * | 4/2020 | Teng .................... | H01L 23/473 |
| 2022/0077024 | A1 | 3/2022 | Teng et al. | |

FOREIGN PATENT DOCUMENTS

| | | | |
|---|---|---|---|
| CN | 114667040 | A | 6/2022 |
| JP | 3780953 | B2 * | 5/2006 |
| TW | 200830376 | A | 7/2008 |
| TW | 201411805 | A | 3/2014 |

* cited by examiner

COOLING COVER AND PACKAGED SEMICONDUCTOR DEVICE INCLUDING THE SAME

BACKGROUND

The semiconductor industry has experienced rapid growth due to ongoing improvements in the integration density of a variety of electronic components (e.g., transistors, diodes, resistors, capacitors, and the like). For the most part, improvement in integration density has resulted from iterative reduction of minimum feature size, which allows more components to be integrated into a given area. As the demand for shrinking electronic devices has grown, smaller packaging techniques of semiconductor dies have emerged.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
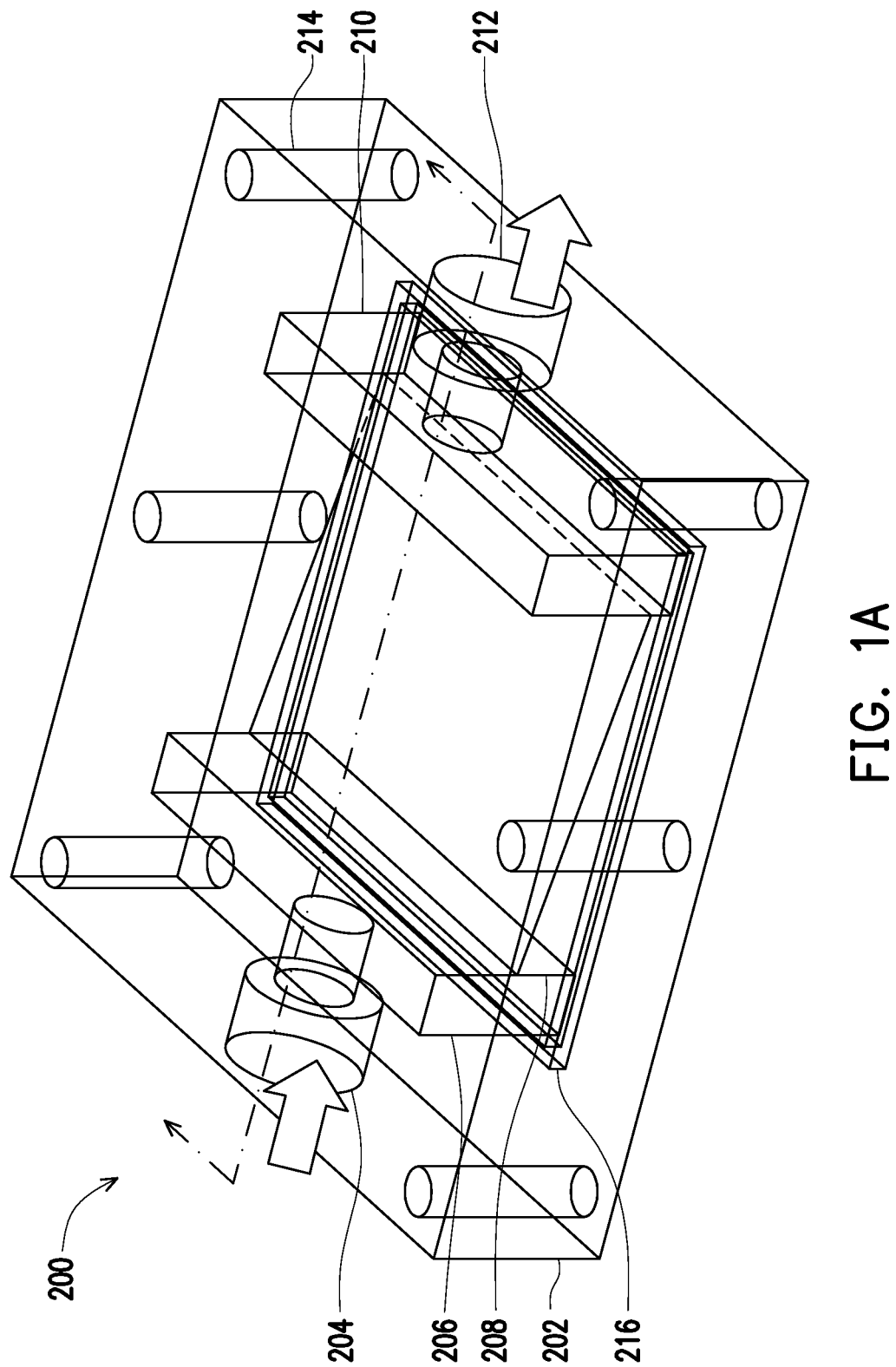
FIGS. 1A and 1B illustrate a perspective view and a cross-sectional view, respectively, of a cooling cover, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a cooling cover, methods for manufacturing the cooling cover, a packaged semiconductor device including the cooling cover, and methods for manufacturing the packaged semiconductor device. The packaged semiconductor device may include one or more chips with channels being formed in backsides thereof. The cooling cover may provide liquid coolant directly to the channels. As such, the cooling cover provides direct cooling to the chips, which improves heat transfer between the chips and the liquid coolant. The cooling cover includes a cooling chamber through which the liquid coolant flows across the backsides of the chips. A surface of the cooling chamber opposite the chips is tilted such that a height of the cooling chamber at an inlet over the chips is greater than a height of the cooling chamber at an outlet over the chips. This causes the flowrate (e.g., the mass flux) of the liquid cooling to increase as the liquid coolant flows across the backsides of the chips. This improves the evenness of cooling provided across the backsides of the chips. As such, the cooling cover may provide improves heat transfer from the chips to the liquid coolant, even cooling of the chips, improved device performance, and reduced device defects caused by overheating of the chips.

Embodiments will be described with respect to a specific context, namely a die-interposer-substrate stacked package using chip-on-wafer-on-substrate (CoWoS) processing. However, in some embodiments, the liquid cooling cover may be applied to other types of packages, such as a die-die-substrate stacked packages, system-on-integrated-chip (SoIC) device packages, integrated fan-out (InFO) packages, and/or other types of semiconductor packages.

Figure 1B:
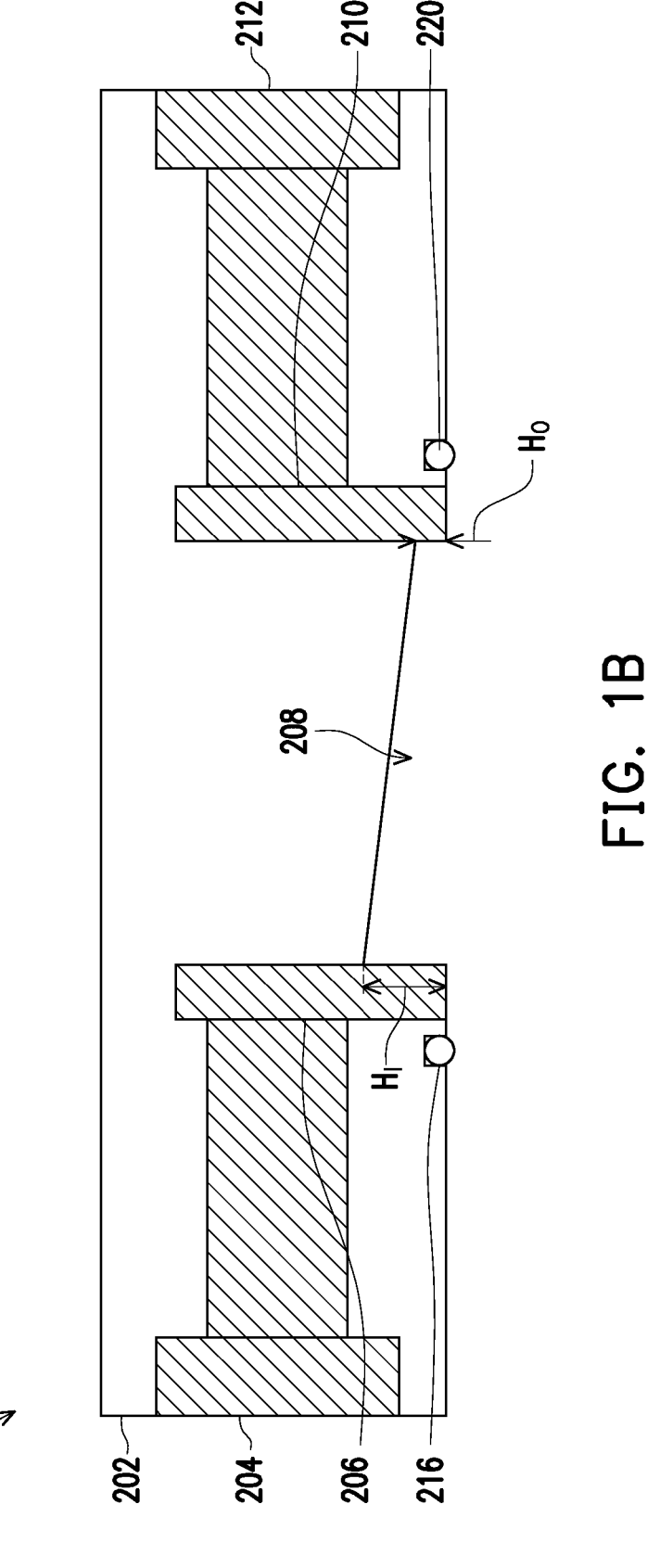

FIGS. 1A and 1B illustrate a perspective view and a cross-sectional view, respectively, of a cooling cover 200, in accordance with some embodiments. The cooling cover 200 may be configured to be in contact with a backside of a semiconductor device, and may supply a liquid coolant to the backside of the semiconductor device to cool the semiconductor device. As illustrated in FIGS. 1A and 1B, the cooling cover 200 includes a cover body 202, an inlet 204, an inlet distributor 206, a cooling chamber 208, an outlet collector 210, and an outlet 212. The liquid coolant is supplied through the inlet 204, spreads through the inlet distributor 206 and into the cooling chamber 208, flows through the cooling chamber 208 and across the backside of the semiconductor device, converges through the outlet collector 210, and flows out of the outlet 212.

As illustrated in FIGS. 1A and 1B, the cooling chamber 208 has trapezoidal shape in a cross-sectional view. In some embodiments, the cooling chamber 208 may have a different shape, but may taper in a direction from the inlet 204 to the outlet 212. The cooling chamber 208 tapers from an inlet height $H_I$ adjacent the inlet distributor 206 to an outlet height $H_O$ adjacent the outlet collector 210. The inlet height $H_I$ may be in a range from about 10 μm to about 2000 μm, the outlet height $H_O$ may be in a range from about 20 μm to about 1000 μm, and a ratio of the inlet height $H_I$ to the outlet height $H_O$ being in a range from about 1 to about 50. The area of the cooling chamber 208 may vary based on a semiconductor device to be cooled by the cooling cover 200. Forming the cooling chamber 208 with the prescribed heights and shape causes a flowrate (e.g., the mass flux) of the liquid coolant to increase as the liquid coolant flows through the cooling chamber 208 across the backside of the semiconductor device from the inlet distributor 206 to the outlet collector 210. As the liquid coolant flows through the cooling chamber 208, the temperature of the liquid coolant increases, which reduces heat transfer to the liquid coolant. However, increasing the flowrate of the liquid coolant increases heat transfer to the liquid coolant. As such, forming the cooling chamber 208 with the prescribed heights and shape ensures that heat transfer to the liquid coolant is even across the backside of the semiconductor device. This allows for improved device performance and reduced device defects caused by overheating in the semiconductor device.

A channel 216 is formed in the cooling cover 200, and a gasket 220 is provided in the channel 216. In some embodiments, an adhesive may be provided in the channel to attach the cooling cover 200 to a semiconductor device. The channel 216 may be formed in the cooling cover 200 by a molding process, a machining process or the like. The gasket 220 may be an o-ring or the like and may be formed from polytetrafluoroethylene (PTFE), nitrile, a fluoropolymer, an ethylene propylene diene monomer rubber (EPDM rubber), or the like. The cooling cover 200 is configured to be placed directly against the backside of the semiconductor device, such that the cooling chamber is adjacent the backside of the semiconductor device. The gasket 220 is included to contain the liquid coolant in the cooling chamber 208 as the liquid coolant flows across the backside of the semiconductor device. In some embodiments, the liquid coolant may flow outside of the cooling chamber 208, but may be contained within the gasket 220. The channel 216 and the gasket 220/adhesive provided in the channel 216 may encircle the cooling chamber 208 to prevent liquid coolant from escaping the cooling chamber 208 when the cooling chamber 200 is used to cool a semiconductor device. Providing the cooling cover 200 directly adjacent the backside of the semiconductor device improves heat transfer from the semiconductor device to the liquid coolant. For example, the heat transfer from the semiconductor device may be greater than about 5 W/mm², and may be improved from conventional cooling structures by about 60%. This allows for improved device performance and reduced device defects caused by overheating in the semiconductor device. Providing the cooling cover 200 directly adjacent the backside of the semiconductor device further allows for other structures, such as thermal interface materials (TIMs), lids, and the like, to be omitted, which reduces costs.

The cover body 202 may be formed as a single piece of material, or several components joined together. The cover body 202 may be a solid piece, with the inlet 204, the inlet distributor 206, the cooling chamber 208, the outlet collector 210, and the outlet 212 formed therein; or may be a hollow piece. In some embodiments, each of the inlet 204, the inlet distributor 206, the cooling chamber 208, the outlet collector 210, and the outlet 212 may be machined in the cover body 202, such as by precision machining. In some embodiments, the cover body 202 may be formed by a molding process, such as injection molding, compression molding, or the like. The cover body 202 may be formed using a combination of molding processes and machining process. The cover body 202 may be formed of a conductive material, which may be a metal such as aluminum, copper, or the like. The cover body 202 may be formed of a plastic or other polymer, such as polyethylene, polyvinyl chloride, an acrylate polymer, or the like. The cover body 202 may be formed of a ceramic material. The cover body 202 may be formed of a material that is inert to the liquid coolant. In some embodiments, the liquid coolant may include water; a solution of ethylene glycol, diethylene glycol, propylene glycol, or the like; an oil; a dielectric liquid; a combination thereof; or the like.

Figure 2:
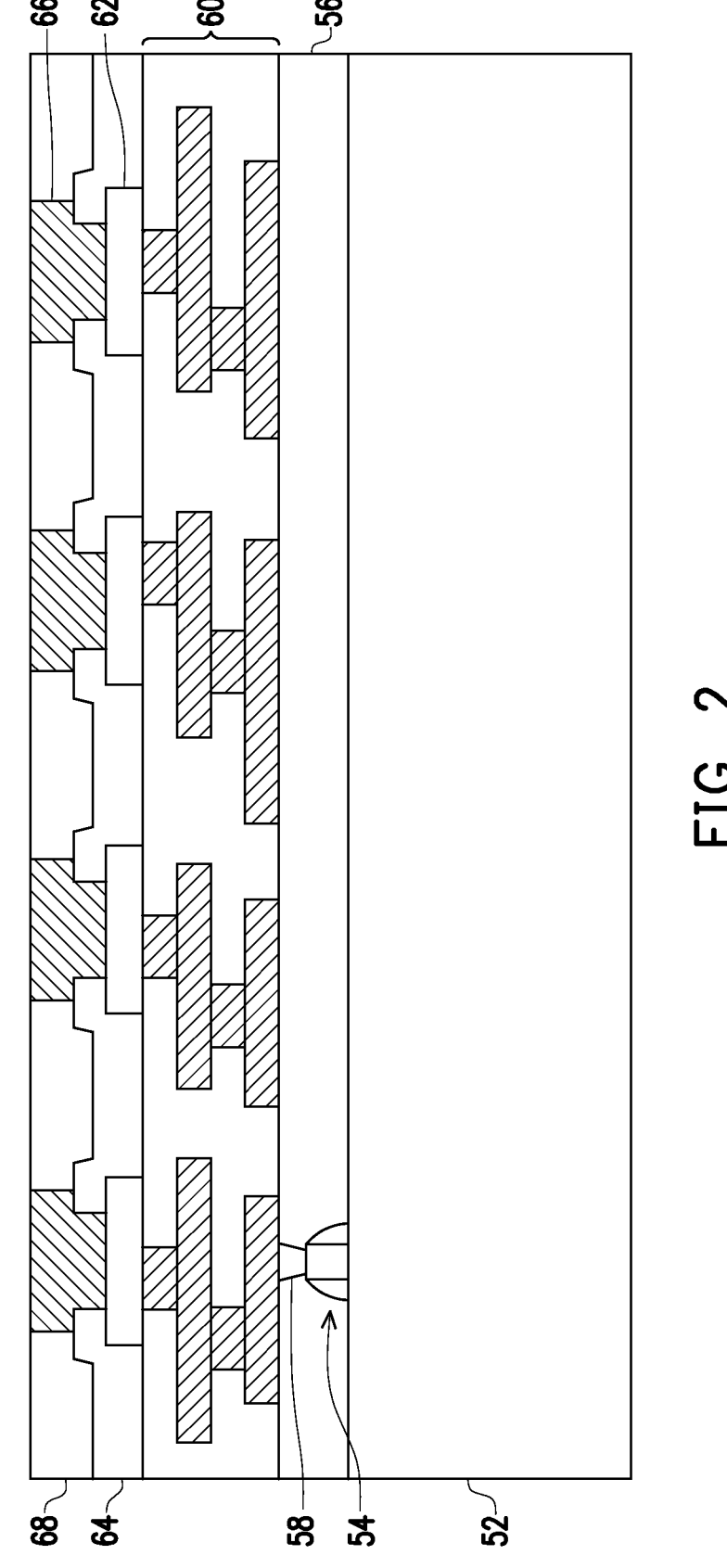
FIGS. 2 through 13 illustrate cross-sectional and top-down views of intermediate stages in the manufacturing of a package structure, in accordance with some embodiments.

FIG. 2 illustrates a cross-sectional view of an integrated circuit die 50 that may be provided in a semiconductor device to be cooled by the cooling cover 200. The integrated circuit die 50 will be packaged in subsequent processing to form an integrated circuit package. The integrated circuit die 50 may be a logic die (e.g., a central processing unit (CPU), a graphics processing unit (GPU), a system-on-a-chip (SoC), an application processor (AP), a microcontroller, or the like); a memory die (e.g., a dynamic random access memory (DRAM) die, a static random access memory (SRAM) die, or the like); a power management die (e.g., a power management integrated circuit (PMIC) die); a radio frequency (RF) die; a sensor die; a micro-electro-mechanical-system (MEMS) die; a signal processing die (e.g., a digital signal processing (DSP) die); a front-end die (e.g., an analog front-end (AFE) die); or a combination thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. In some embodiments, the integrated circuit die 50 includes a semiconductor substrate 52, such as silicon, doped or un-doped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may be used. The semiconductor substrate 52 has an active surface (e.g., the surface facing upwards in FIG. 2), sometimes referred to as a front-side, and an inactive surface (e.g., the surface facing downwards in FIG. 2), sometimes referred to as a backside.

Devices (represented by a transistor) 54 may be formed at the front-side of the semiconductor substrate 52. The devices 54 may be active devices (e.g., transistors, diodes, or the like), capacitors, resistors, or the like. An inter-layer dielectric (ILD) 56 is on the front-side of the semiconductor substrate 52. The ILD 56 surrounds and may cover the devices 54. The ILD 56 may include one or more dielectric layers formed of materials such as phosphosilicate glass (PSG), boro-silicate glass (BSG), boron-doped phosphosilicate glass (BPSG), un-doped silicate glass (USG), or the like.

Conductive plugs 58 extend through the ILD 56, and are electrically and physically coupled to the devices 54. In embodiments in which the devices 54 are transistors, the conductive plugs 58 may be coupled to gates and source/drain regions (e.g., source region and/or drain regions) of the transistors. The conductive plugs 58 may be formed of tungsten, cobalt, nickel, copper, silver, gold, aluminum, the like, or combinations thereof. An interconnect structure 60 is formed on the ILD 56 and conductive plugs 58. The interconnect structure 60 interconnects the devices 54 to form integrated circuits. In some embodiments, the interconnect structure 60 may be formed by metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the front-side of the semiconductor substrate 52, such as in and/or on the interconnect structure 60. Solder regions (e.g., solder balls or solder bumps) may be disposed on the pads 62. The solder regions may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged. Dies that fail the CP testing, are not packaged. After testing, the solder regions may be removed in subsequent processing steps.

One or more passivation films 64 are on the integrated circuit die 50, such as on portions of the interconnect structure 60 and the pads 62. Openings are formed extending through the passivation films 64 to the pads 62. Die connectors 66, such as conductive pillars (e.g., formed of a metal such as copper), are formed in the openings extending through the passivation films 64. The die connectors 66 may be physically and electrically coupled to respective ones of the pads 62. The die connectors 66 may be formed by plating, or the like. The die connectors 66 are electrically coupled to the integrated circuits of the integrated circuit die 50.

A dielectric layer 68 may (or may not) be on the front-side of the semiconductor substrate 52, such as on the passivation films 64 and around the die connectors 66. The dielectric layer 68 laterally encapsulates the die connectors 66, and the dielectric layer 68 is laterally coterminous with the semiconductor substrate 52. The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed by spin coating, lamination, chemical vapor deposition (CVD), or the like. Initially, the dielectric layer 68 may bury the die connectors 66, such that a topmost surface of the dielectric layer 68 is above topmost surfaces of the die connectors 66. In some embodiments, solder regions may be formed on the die connectors 66, and the dielectric layer 68 may bury the solder regions. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device, such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 3 through 12 are cross-sectional views of intermediate stages in the manufacturing of integrated circuit packages 160 (see FIG. 12), in accordance with some embodiments. Specifically, an integrated circuit package 160 is formed by bonding integrated circuit dies 50 to a wafer 100

Figure 3:
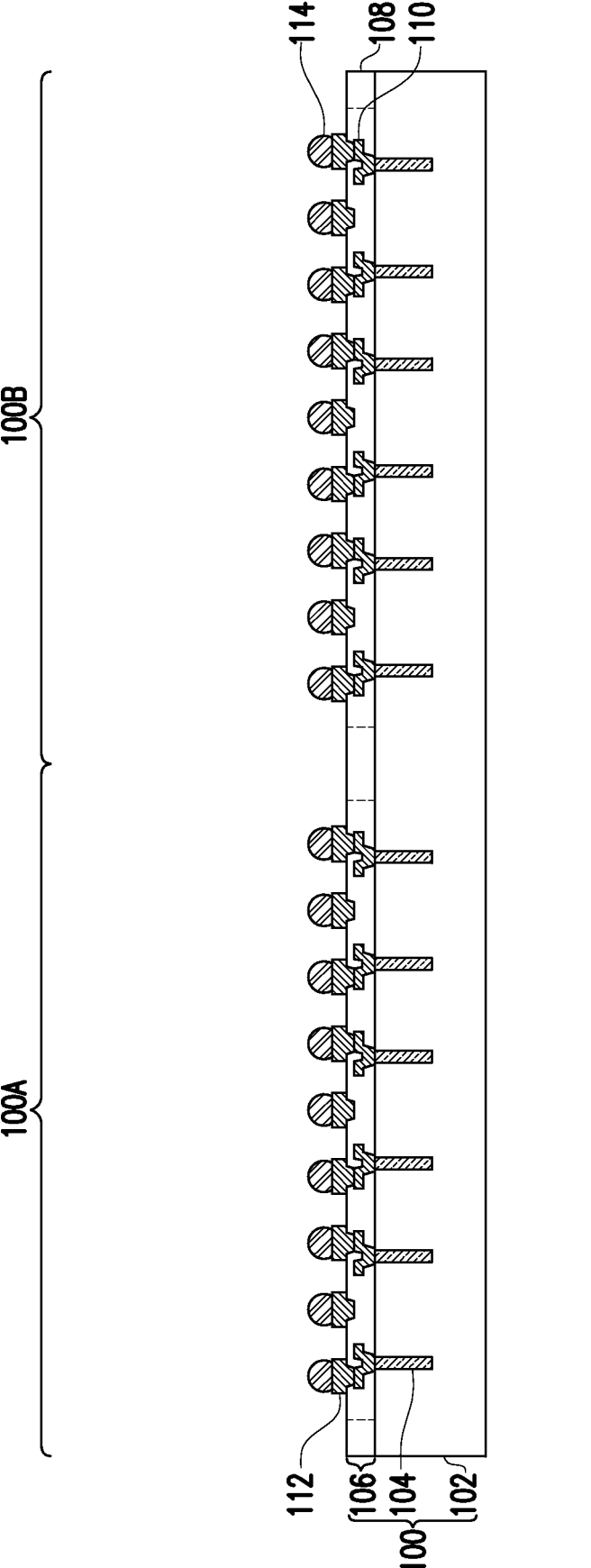

(see FIG. 3). In some embodiments, the integrated circuit package 160 is a chip-on-wafer (CoW) package, although it should be appreciated that embodiments may be applied to other three-dimensional integrated circuit (3DIC) packages. The integrated circuit package 160 may be mounted to a substrate 150. In some embodiments, the resulting package is a chip-on-wafer-on-substrate (CoWoS) package (illustrated in FIG. 13), although it should be appreciated that embodiments may be applied to other 3DIC packages.

Processing of two package regions, a first package region 100A and a second package region 100B of a wafer 100 is illustrated in subsequent cross-sectional views, and processing of four package regions, the first package region 100A, the second package region 100B, a third package region 100C, and a fourth package region 100D of a wafer 100 is illustrated in subsequent top-down views. It should be appreciated that any number of package regions of a wafer 100 may be processed simultaneously and singulated to form multiple integrated circuit packages 160 from the singulated portions of the wafer 100.

In FIG. 3, a wafer 100 is obtained or formed. The wafer 100 comprises devices in a plurality of package regions, such as a first package region 100A and a second package region 100B illustrated in FIG. 3. Each of the package regions 100A-100B will be singulated in subsequent processing to be included in an integrated circuit package 160 (illustrated in FIG. 12). The wafer 100 may be singulated to form interposers, integrated circuit dies, or the like. In some embodiments, the wafer 100 may include a substrate 102, an interconnect structure 106, and conductive vias 104.

The substrate 102 may be a bulk semiconductor substrate, a semiconductor-on-insulator (SOI) substrate, a multi-layered semiconductor substrate, or the like. The substrate 102 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 102 may be doped or un-doped. In some embodiments, the substrate 102 is free from active devices, although the substrate 102 may include passive devices formed in and/or on a front surface of the substrate 102 (e.g., the surface facing downwards in FIG. 2), sometimes referred to as a front-side. In embodiments where integrated circuits devices are formed in the substrate 102, active devices such as transistors, diodes, and the like, as well as passive devices, such as capacitors, resistors, and the like, may be formed in and/or on the front-side of the substrate 102.

The interconnect structure 106 is over the front-side of the substrate 102, and is used to electrically connect the devices (if any) of the substrate 102. The interconnect structure 106 may include one or more dielectric layer(s) 108 and one or more metallization layer(s) 110 in the dielectric layers 108. Acceptable dielectric materials for the dielectric layers 108 include oxides (such as silicon oxide or aluminum oxide); nitrides (such as silicon nitride); carbides (such as silicon carbide); the like; or combinations thereof, such as silicon oxynitride, silicon oxycarbide, silicon carbonitride, silicon oxycarbonitride, or the like. Other dielectric materials may also be used, such as polymers, which may include polybenzoxazole (PBO), polyimide, benzocyclobuten (BCB)-based polymers, or the like. The metallization layers 110 may include conductive vias and/or conductive lines to interconnect devices of the substrate 102 and/or external devices together. The metallization layers 110 may be formed of a conductive material, such as a metal, which may include copper, cobalt, aluminum, gold, combinations thereof, or the like. The interconnect structure 106 may be formed by a damascene process, such as a single damascene process, a dual damascene process, or the like.

The conductive vias 104 extend into the interconnect structure 106 and/or the substrate 102. The conductive vias 104 are electrically coupled to metallization layers 110 of the interconnect structure 106. In some embodiments, the conductive vias 104 may be formed by forming recesses in the interconnect structure 106 and/or the substrate 102 using etching, milling, laser techniques, a combination thereof, or the like. A thin dielectric material may be formed in the recesses, such as by using an oxidation technique. A thin barrier layer may be conformally deposited in the recesses, such as by CVD, atomic layer deposition (ALD), physical vapor deposition (PVD), thermal oxidation, a combination thereof, and/or the like. The barrier layer may be formed of an oxide, a nitride, a carbide, combinations thereof, or the like. A conductive material may be deposited over the barrier layer and in the recesses. The conductive material may be formed by an electro-chemical plating process, CVD, ALD, PVD, a combination thereof, and/or the like. Examples of the conductive material include copper, tungsten, aluminum, silver, gold, a combination thereof, or the like. Excess materials of the conductive material and the barrier layer may be removed from surfaces of the interconnect structure 106 and/or the substrate 102 by a planarization process, such as a chemical-mechanical polish (CMP), a grinding process, an etch-back process, or the like. Remaining portions of the barrier layer and the conductive material form the conductive vias 104.

Bond pads 112 are formed on the metallization layers 110 and the dielectric layers 108 of the interconnect structure 106 and conductive connectors 114 are formed on the bond pads 112. The bond pads 112 may be formed by forming a seed layer (not separately illustrated) on the metallization layers 110 and the dielectric layers 108. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using PVD or the like. A photoresist is formed and patterned on the seed layer. The photoresist may be formed by spin coating or the like and may be exposed to light for patterning. The pattern of the photoresist corresponds to the bond pads 112. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed using an acceptable etching process. The remaining portions of the seed layer and the conductive material form the bond pads 112.

The conductive connectors 114 are formed on the bond pads 112. The conductive connectors 114 may be ball grid array (BGA) connectors, solder balls, controlled collapse chip connection (C4) bumps, micro bumps, electroless nickel-electroless palladium-immersion gold technique (ENEPIG) formed bumps, or the like. The conductive connectors 114 may be formed of a conductive material that is reflowable, such as solder, copper, aluminum, gold, nickel, silver, palladium, tin, the like, or a combination thereof. In some embodiments, the conductive connectors 114 are formed by initially forming a layer of solder through evaporation, electroplating, printing, solder transfer, ball placement, or the like. Once the layer of solder has been formed on the structure, a reflow may be performed in order to shape the material into desired bump shapes.

Figure 4A:
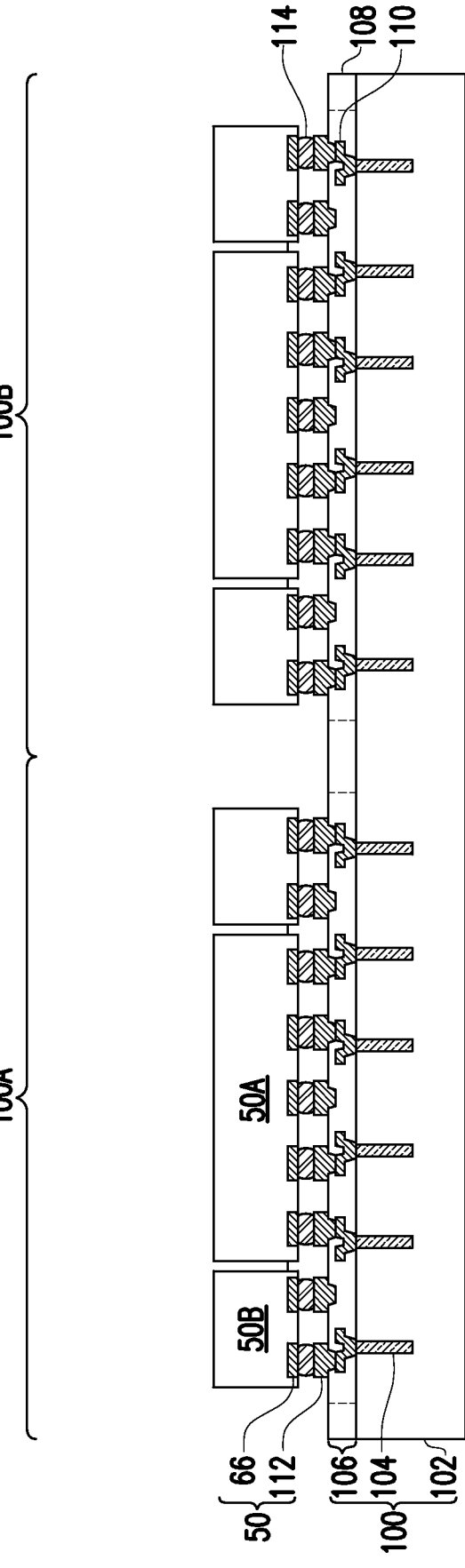
Figure 4B:
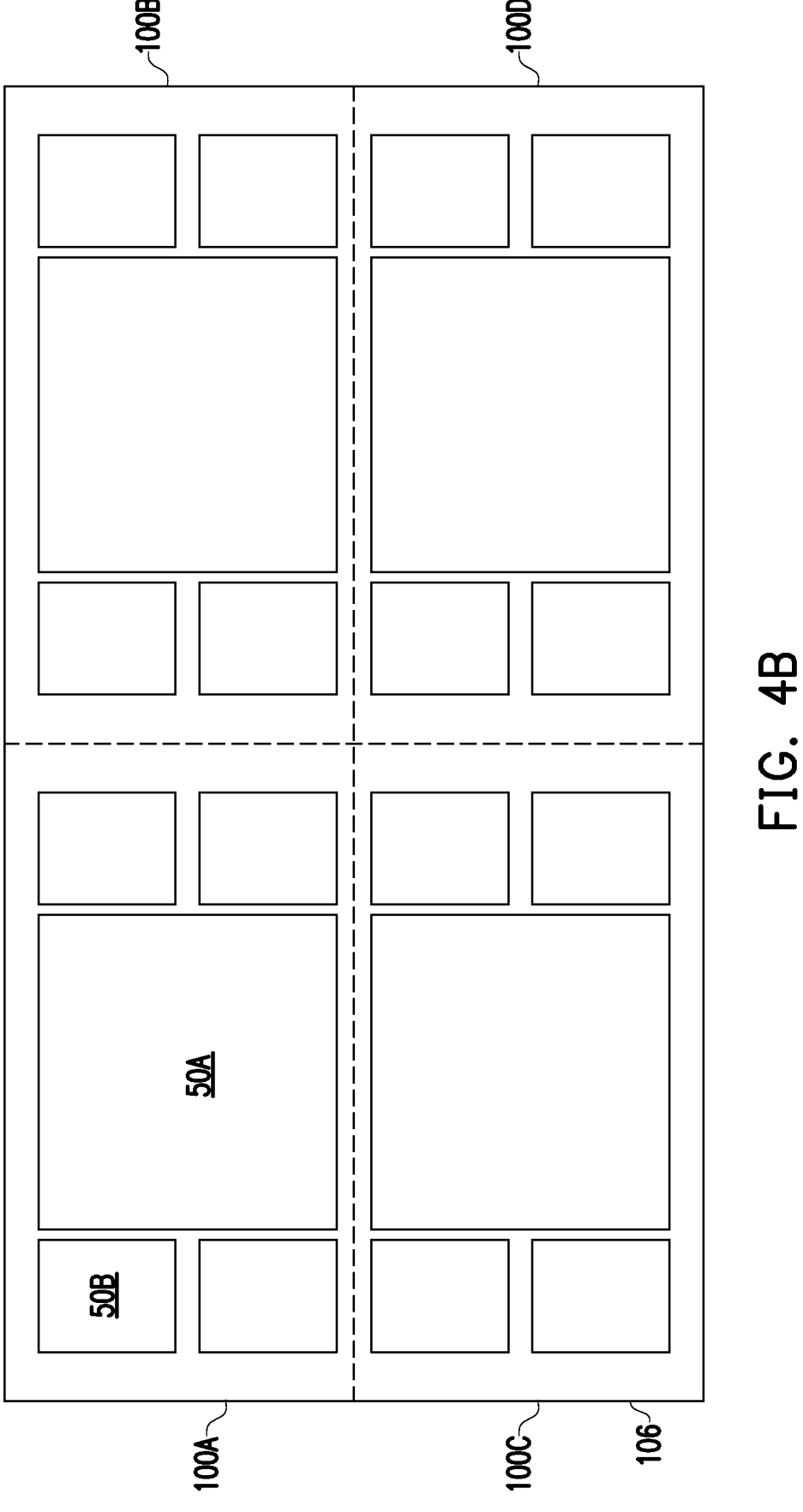

In FIGS. 4A and 4B, integrated circuit dies 50 (e.g., a first integrated circuit die 50A and a plurality of second integrated circuit dies 50B) are attached to the wafer 100. A desired type and quantity of integrated circuit dies 50 are attached in the package regions. In the illustrated embodiment, multiple integrated circuit dies 50 are placed adjacent one another in each package region, including the first integrated circuit die 50A and the second integrated circuit dies 50B. The first integrated circuit die 50A in each package region is between the second integrated circuit dies 50B. As illustrated in FIG. 3B, one of the first integrated circuit dies 50A and four of the second integrated circuit dies 50B may be coupled in each of the package regions 100A-100D. However, any number of the first integrated circuit dies 50A and the second integrated circuit dies may be formed in each of the package regions 100A-100D. The first integrated circuit die may have a different function from the second integrated circuit dies 50B. For example, in some embodiments, the first integrated circuit die 50A may be a logic device, such as a CPU, a GPU, an SoC, a microcontroller, or the like. The second integrated circuit dies 50B may be memory devices, such as DRAM dies, SRAM dies, HMC modules, HBM modules, or the like. The first integrated circuit die 50A and the second integrated circuit dies 50B may be formed in processes of a same technology node, or may be formed in processes of different technology nodes. For example, the first integrated circuit die 50A may be formed by processes of a more advanced process node than the second integrated circuit dies 50B.

In the illustrated embodiment, the integrated circuit dies 50 are attached to the wafer 100 with solder bonds, such as with the conductive connectors 114. The integrated circuit dies 50 may be placed on the interconnect structure 106 using a pick-and-place tool. Attaching the integrated circuit dies 50 to the wafer 100 may include placing the integrated circuit dies 50 on the wafer 100 and reflowing the conductive connectors 114. The conductive connectors 114 form joints between the bond pads 112 of the wafer 100 and the die connectors 66 of the integrated circuit dies 50, physically and electrically coupling the integrated circuit dies 50 to the wafer 100.

Figure 5:
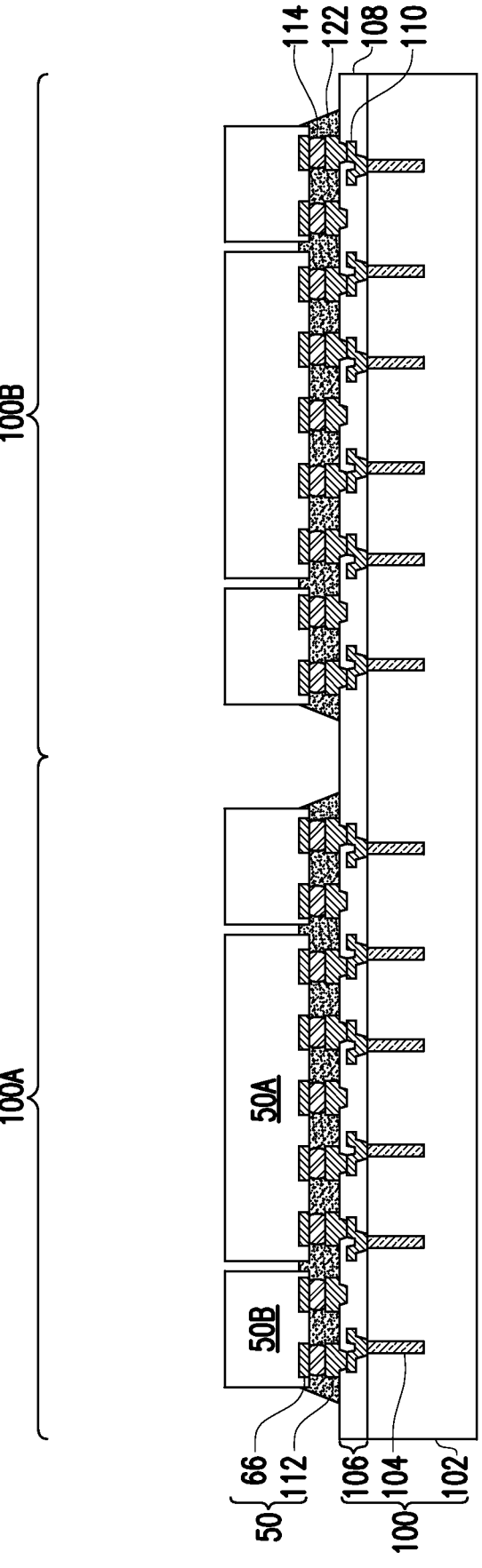

In FIG. 5, an underfill 122 may be formed around the conductive connectors 114, and between the wafer 100 and the integrated circuit dies 50. The underfill 122 may reduce stress and protect the joints resulting from the reflowing of the conductive connectors 114. The underfill 122 may be formed of an underfill material such as a molding compound, epoxy, or the like. The underfill 122 may be formed by a capillary flow process after the integrated circuit dies 50 are attached to the wafer 100, or may be formed by a suitable deposition method before the integrated circuit dies 50 are attached to the wafer 100. The underfill 122 may be applied in liquid or semi-liquid form and subsequently cured. In some embodiments, the underfill 122 may extend at least partially up side surfaces of the integrated circuit dies 50. Although the underfill 122 is illustrated as having straight side surfaces, the underfill 122 may have curved side surfaces.

In some embodiments, the integrated circuit dies 50 are attached to the wafer 100 with direct bonds. For example, hybrid bonding, fusion bonding, dielectric bonding, metal bonding, or the like may be used to directly bond corresponding dielectric layers, bond pads, and/or die connectors of the wafer 100 and the integrated circuit dies 50 without the use of adhesive or solder. The underfill 122 may be omitted in embodiments in which direct bonding is used to attach the integrated circuit dies 50 to the wafer 100.

Figure 6:
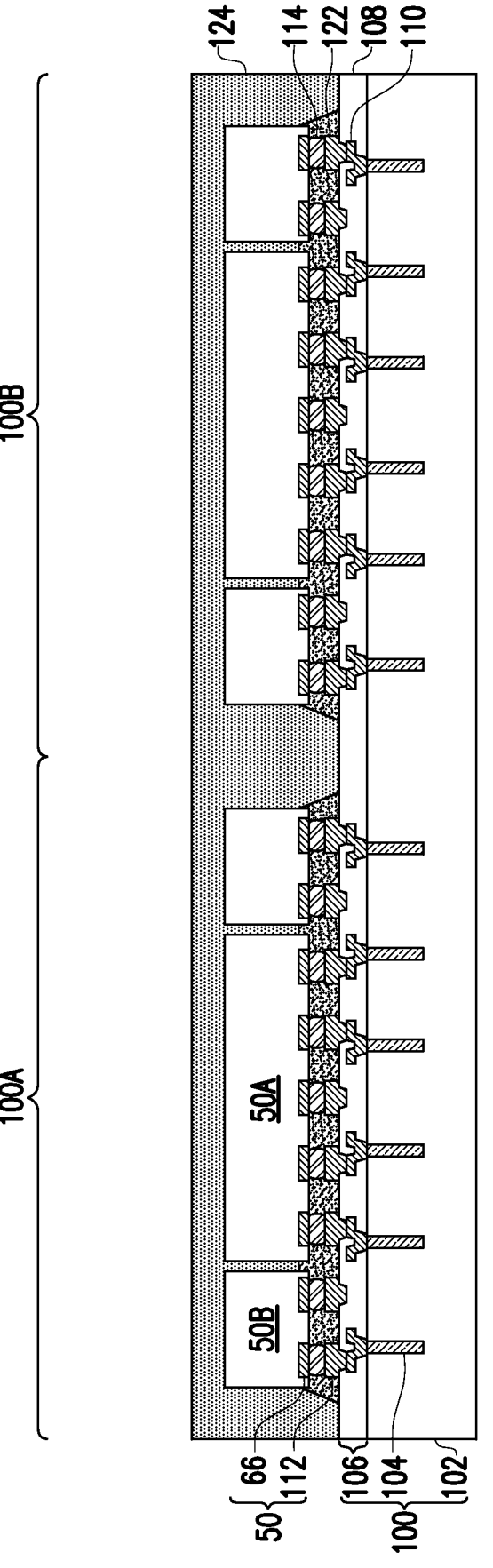

In FIG. 6, an encapsulant 124 is formed on the wafer 100 and the integrated circuit dies 50. After formation, the encapsulant 124 encapsulates the first integrated circuit dies 50A, the second integrated circuit dies 50B, and the underfill 122. The encapsulant 124 may be a molding compound, epoxy, or the like. The encapsulant 124 may be applied by compression molding, transfer molding, or the like, and may be formed on the wafer 100 such that the first integrated circuit dies 50A and/or the second integrated circuit dies 50B are buried or covered. The encapsulant 124 may further be formed in gap regions between the first integrated circuit dies 50A and/or the second integrated circuit dies 50B. The encapsulant 124 may be applied in liquid or semi-liquid form and subsequently cured.

Figure 7:
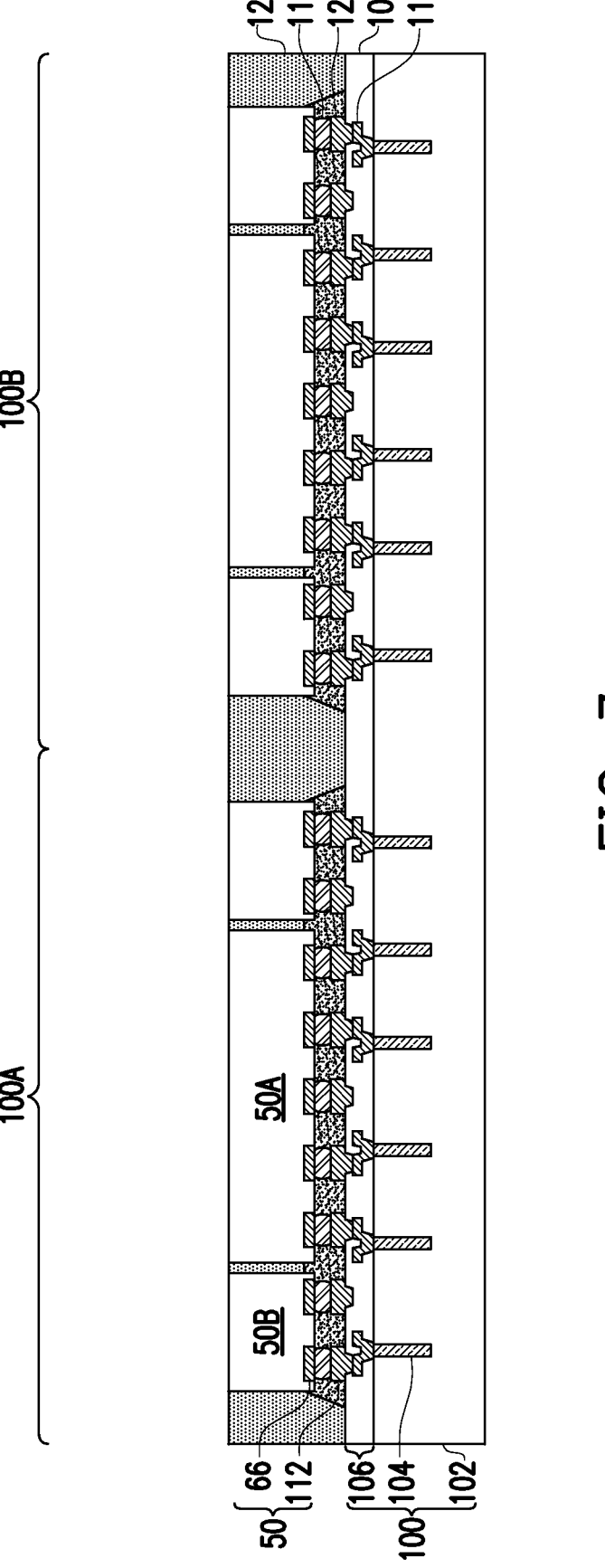

In FIG. 7, a planarization process is performed on the encapsulant 124 to expose the first integrated circuit dies 50A and the second integrated circuit dies 50B. The planarization process may also remove material of the first integrated circuit dies 50A and/or the second integrated circuit dies 50B until the first integrated circuit dies 50A and the second integrated circuit dies 50B are exposed. Top surfaces of the first integrated circuit dies 50A, the second integrated circuit dies 50B, and the encapsulant 124 may be substantially coplanar (e.g., level) after the planarization process, within process variations. The planarization process may be a CMP, a grinding process, an etch-back process, combinations thereof, or the like. In some embodiments, the planarization may be omitted, for example, if the first integrated circuit dies 50A and/or the second integrated circuit dies 50B are already exposed.

Figure 8A:
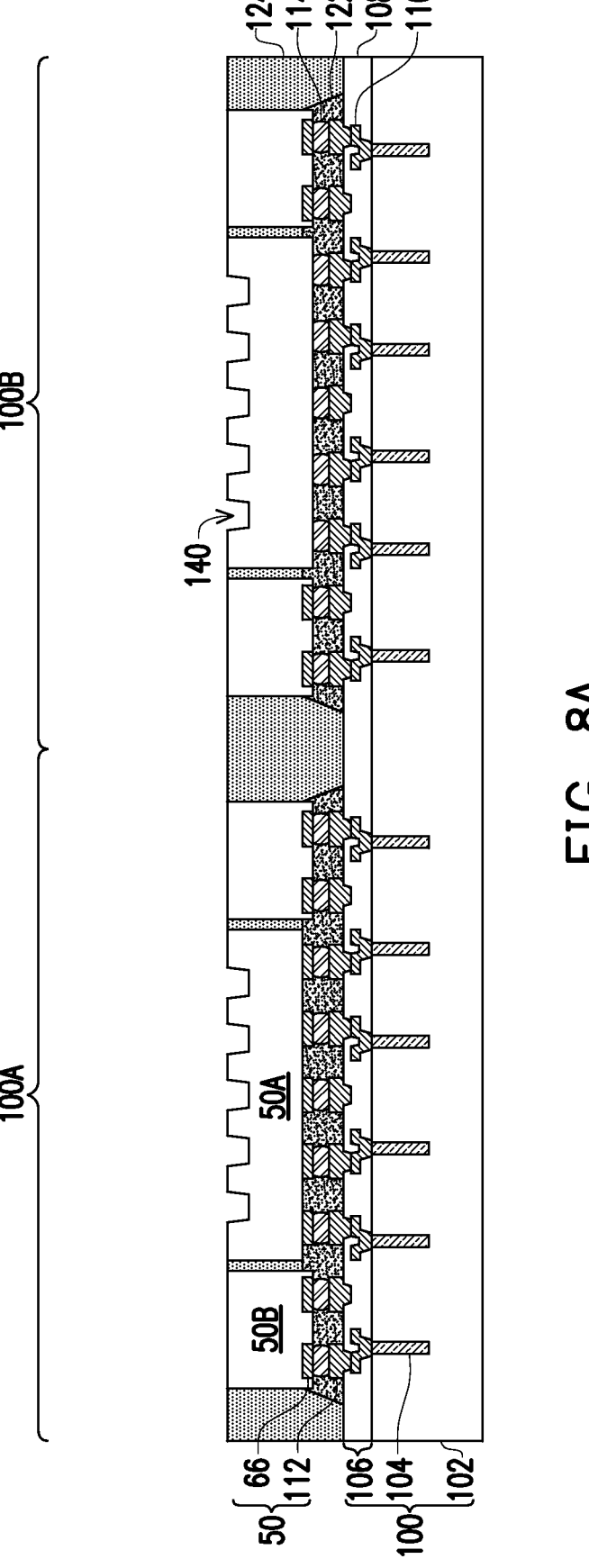
Figure 8B:
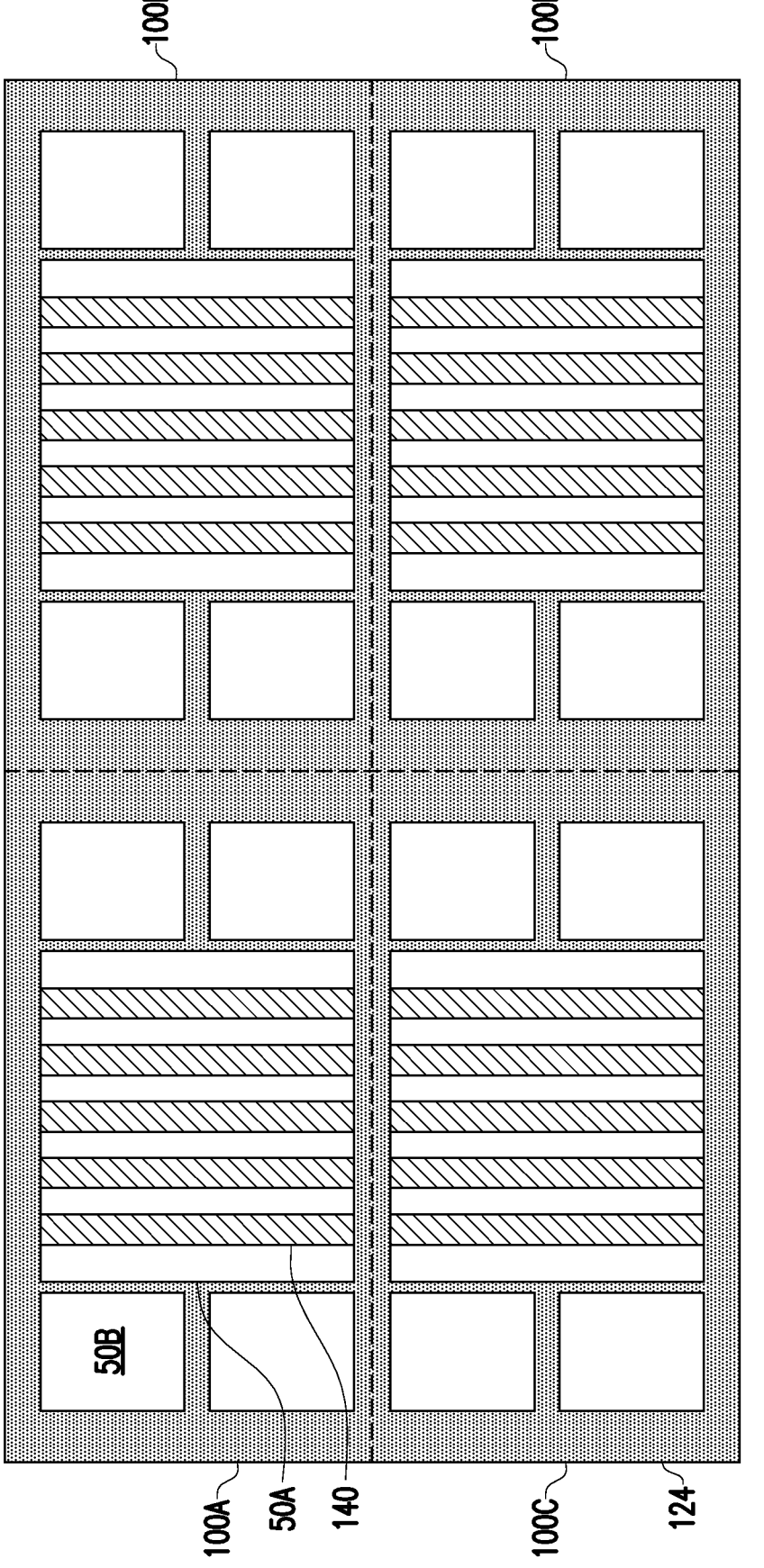
Figure 8C:
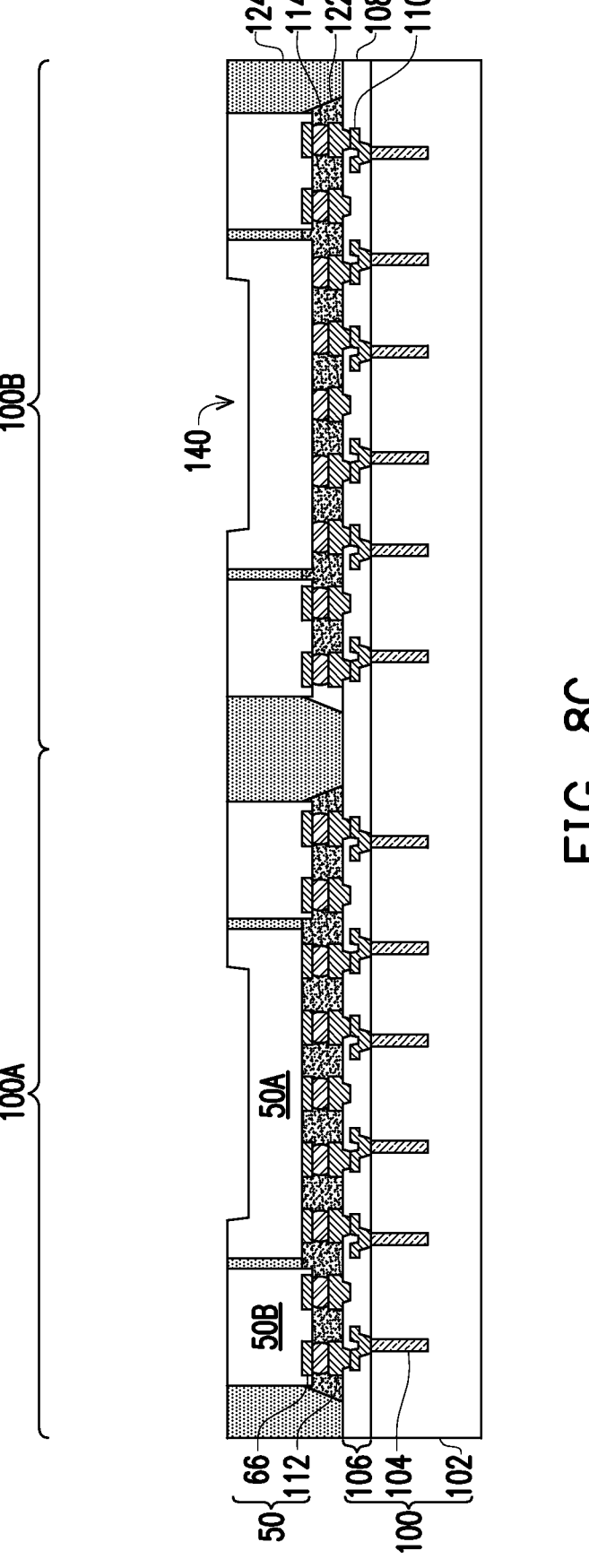
Figure 8D:
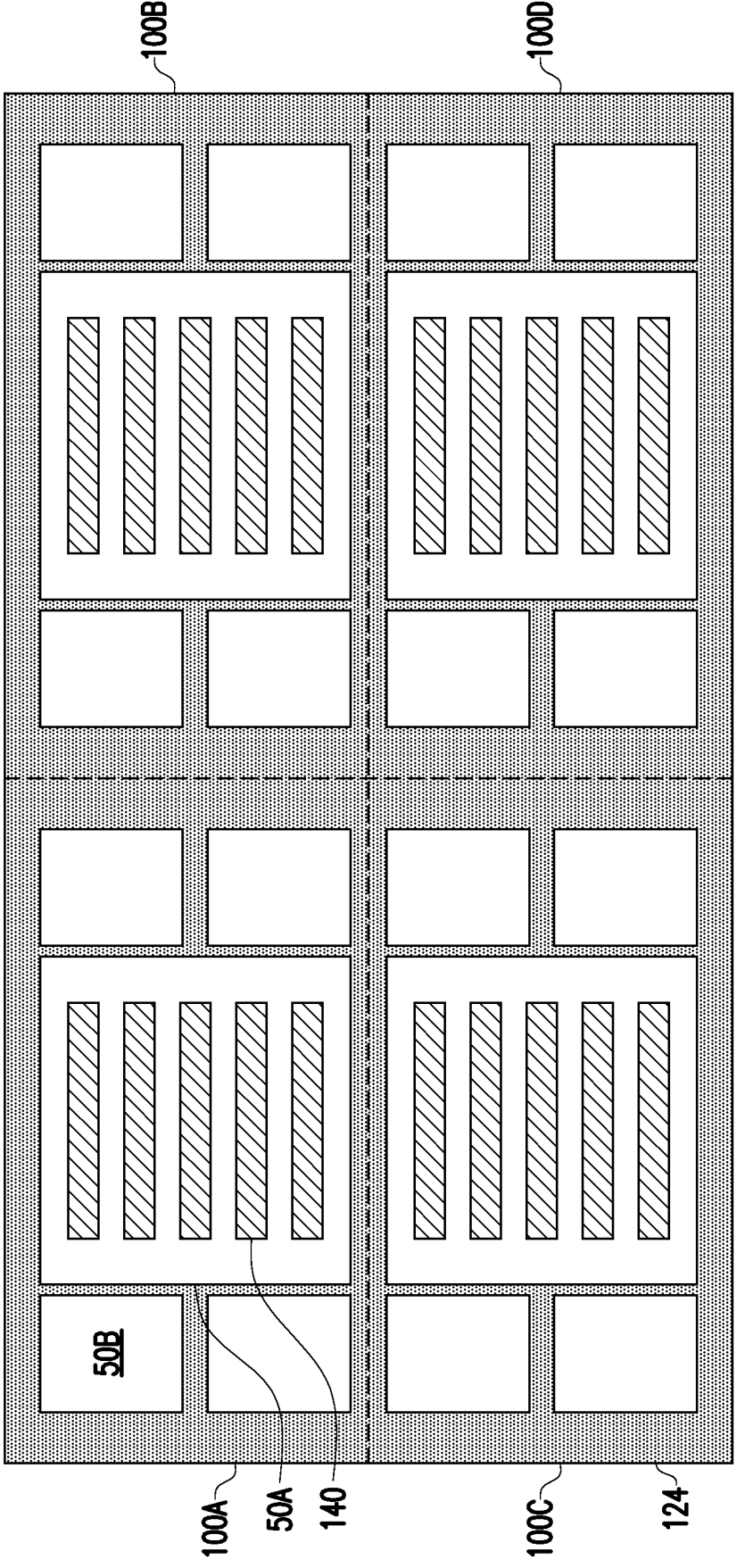
Figure 8E:
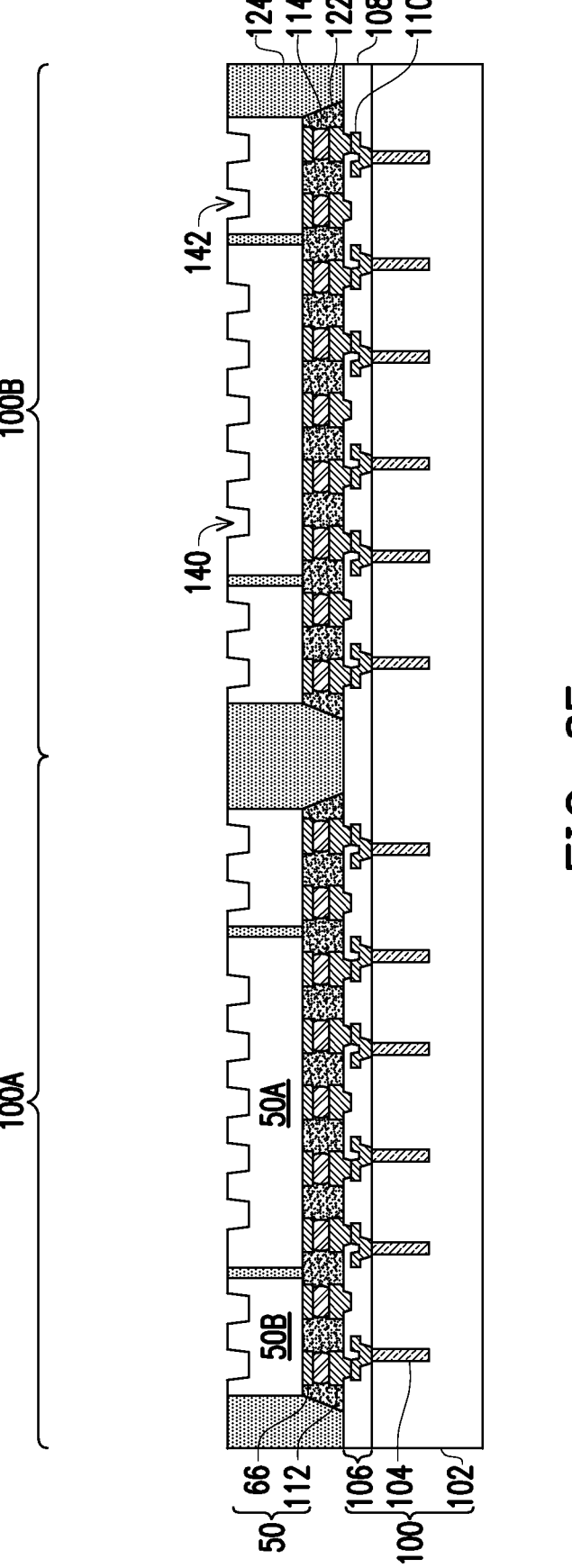
Figure 8F:
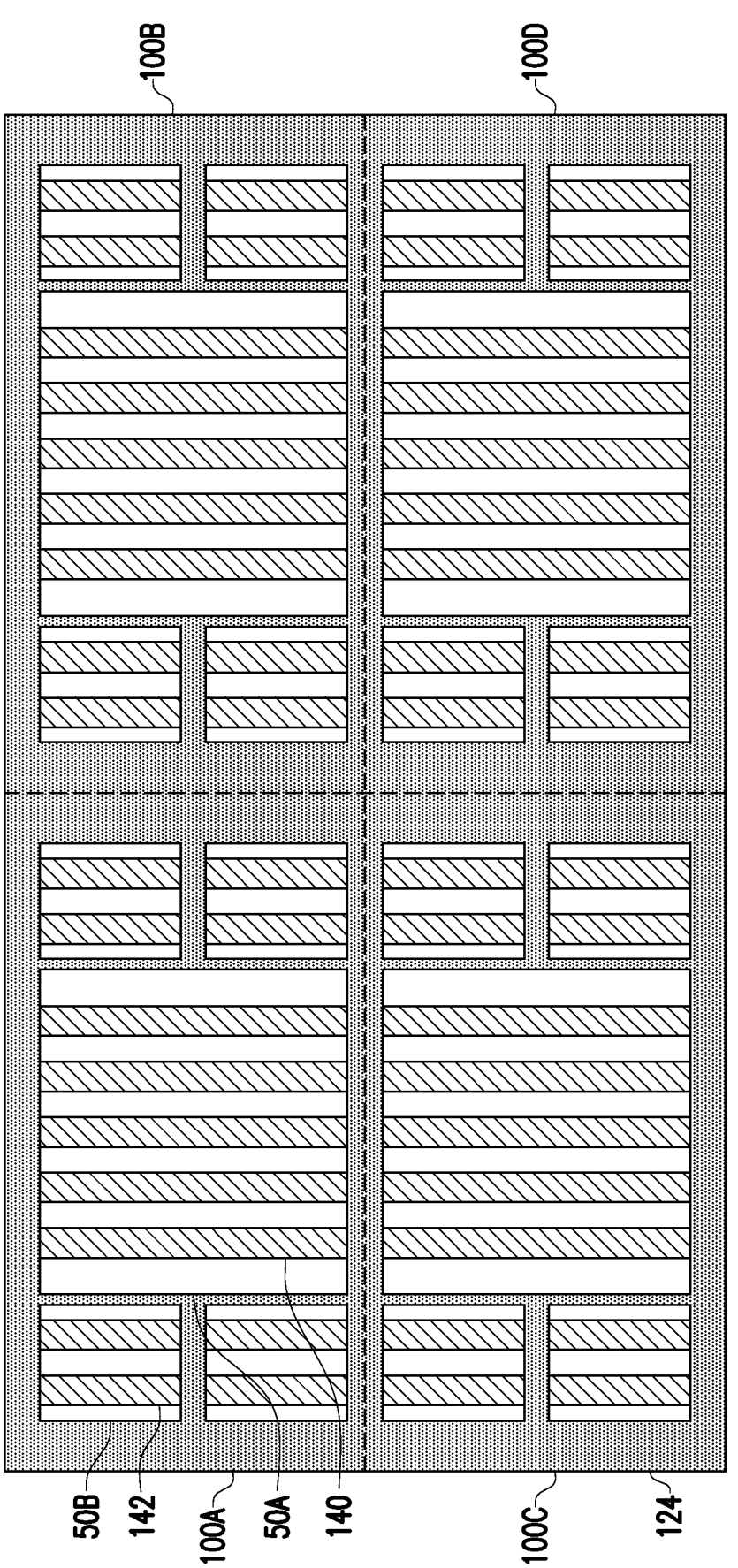
Figure 8G:
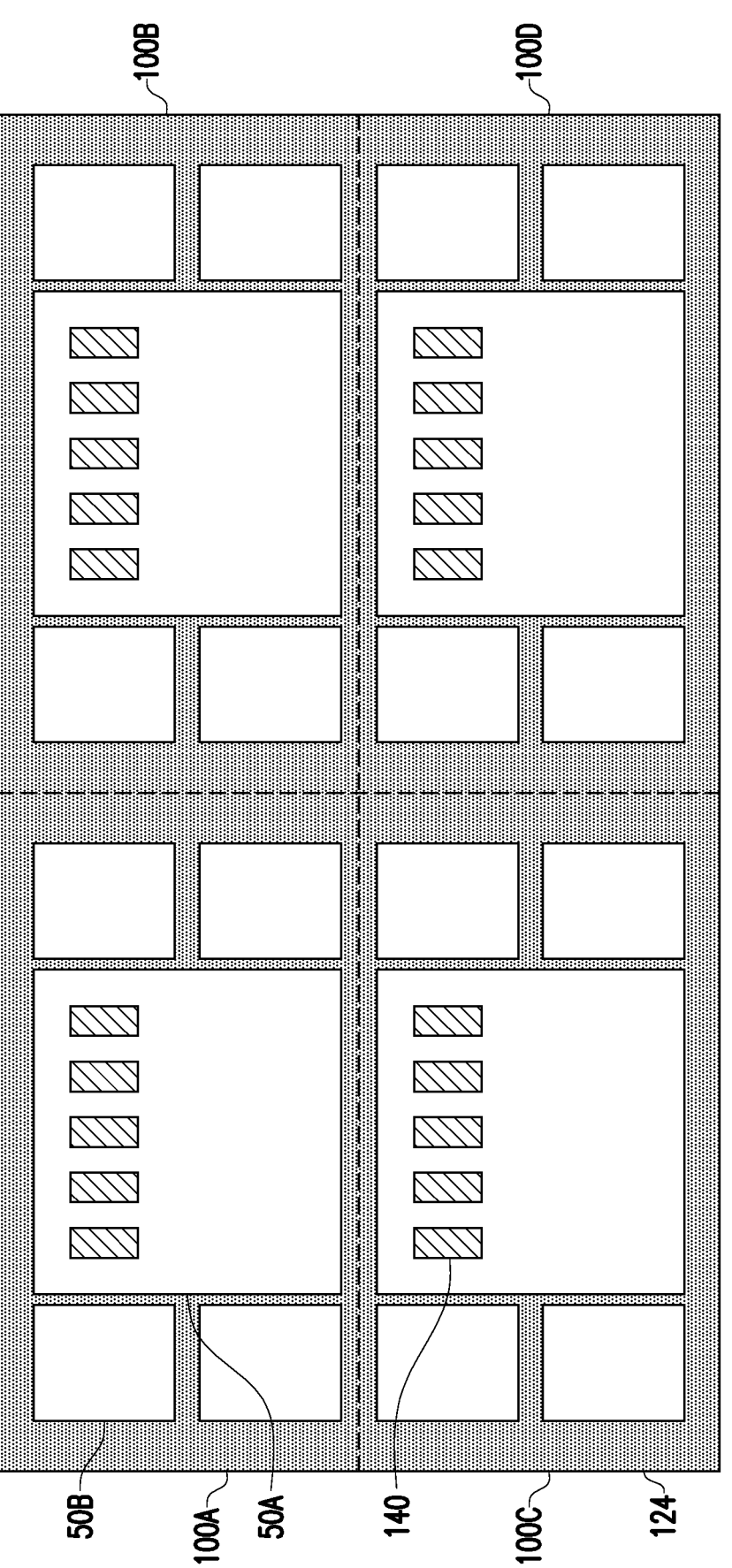
Figure 8H:
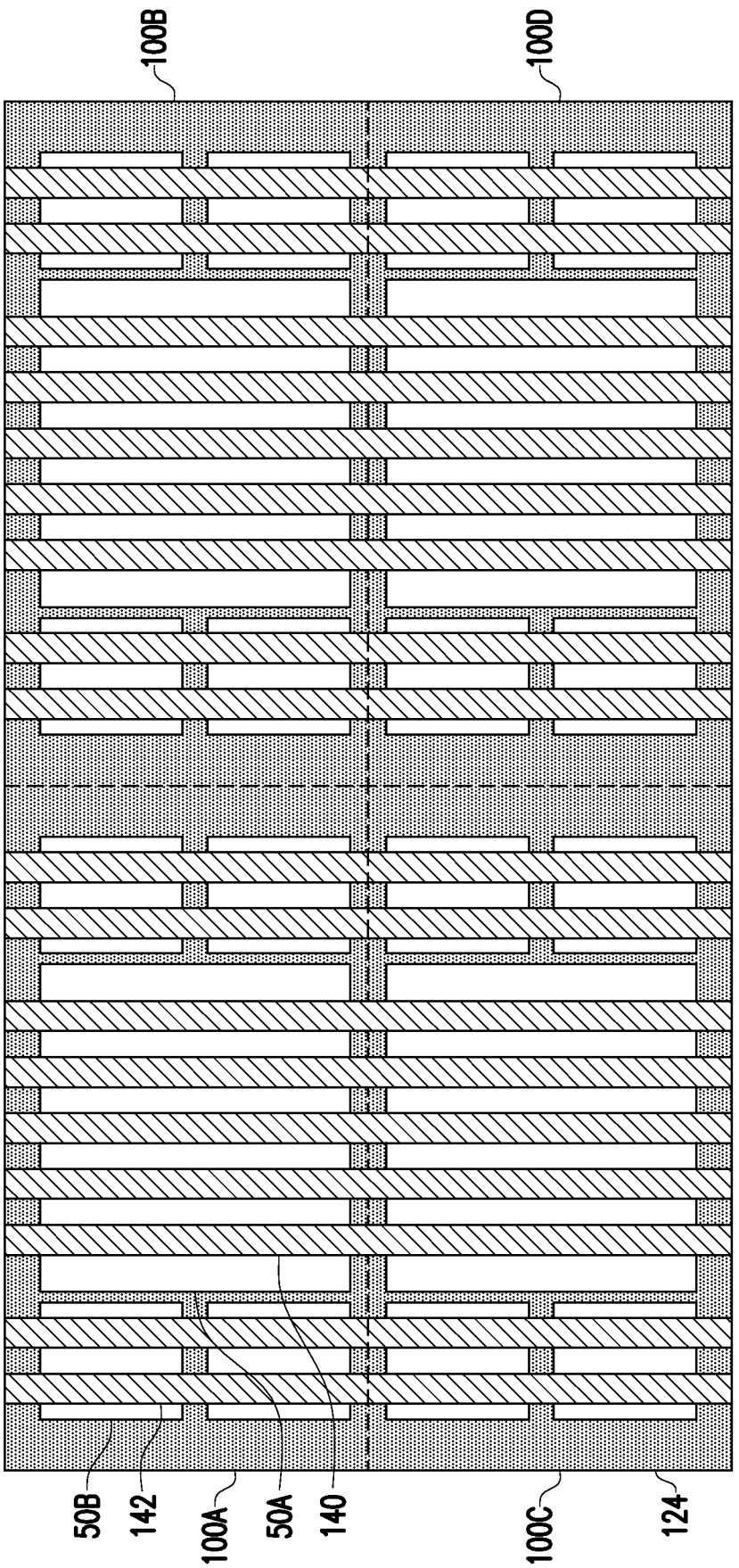

In FIGS. 8A through 8H, channels are formed in backsides of the integrated circuit dies 50 and/or the encapsulant 124. In FIGS. 8A through 8D and 8G, channels 140 are formed in backsides of the first integrated circuit dies 50A. In FIGS. 8E and 8F, channels 140 and channels 142 are formed in backsides of the first integrated circuit dies 50A and the second integrated circuit dies 50B, respectively. In FIG. 8H, channels 140 and channels 142 are formed in backsides of the first integrated circuit dies 50A, the second integrated circuit dies 50B, and the encapsulant 124.

The channels 140 and/or the channels 142 may be formed by suitable methods. In some embodiments, the channels 140 and the channels 142 may be formed by mechanical processes, such as mechanical die sawing or the like. The channels 140 and the channels 142 may be formed by laser cutting or the like. The channels 140 and the channels 142 may be formed by acceptable photolithography and etching techniques. In some embodiments, the etching techniques may include isotropic etching, such as wet etching or the like. In some embodiments, an etchant used to form the channels 140 and the channels 142 may comprise potassium hydroxide (KOH). The channels 140 and the channels 142 may have widths in a range from about 10 µm to about 3000 µm, depths in a range from about 10 µm to about 700 µm, and pitches in a range from about 15 µm to about 5000 µm. The shape of the channels 140 and the channels 142 may be controlled by controlling the parameters of the method used to form the channels 140 and the channels 142. In embodiments in which mechanical die sawing is used to form the channels 140 and the channels 142, an appropriate blade may be selected to control the shape of the channels 140 and the channels 142. The channels 140 and the channels 142 may be rectangular, U-shaped, V-shaped, or the like, and may taper in a direction towards front-sides of the first integrated circuit dies 50A and the second integrated circuit dies 50B.

In FIGS. 8A and 8B, channels 140 are provided in backsides of the first integrated circuit dies 50A, and the second integrated circuit dies 50B and the encapsulant 124 are free from the channels 140 and the channels 142. Each of the channels 140 may be parallel to one another. The channels 140 may extend to opposite edges of the first integrated circuit dies 50A perpendicular to longitudinal axes of the channels 140. The channels 140 may be spaced apart from opposite edges of the first integrated circuit dies 50A parallel to the longitudinal axes of the channels 140. Although five channels 140 are illustrated as being formed in each of the first integrated circuit dies 50A, more or fewer of the channels 140 may be formed in each of the first integrated circuit dies 50A. The embodiment of FIGS. 8A and 8B is illustrated in subsequent Figures for ease of illustration.

In FIGS. 8C and 8D, channels 140 are provided in backsides of the first integrated circuit dies 50A, and the second integrated circuit dies 50B and the encapsulant 124 are free from the channels 140 and the channels 142. The channels 140 are perpendicular to the channels 140 illustrated in FIGS. 8A and 8B. The channels 140 may be spaced apart from opposite edges of the first integrated circuit dies 50A perpendicular to longitudinal axes of the channels 140. The channels 140 may also be spaced apart from opposite edges of the first integrated circuit dies 50A parallel to the longitudinal axes of the channels 140. Although five channels 140 are illustrated as being formed in each of the first integrated circuit dies 50A, more or fewer of the channels 140 may be formed in each of the first integrated circuit dies 50A.

In FIGS. 8E and 8F, channels 140 are provided in backsides of the first integrated circuit dies 50A, channels 142 are provided in backsides of the second integrated circuit dies 50B, and the encapsulant 124 is free from the channels 140 and the channels 142. The channels 140 and the channels 142 may be parallel to one another. However, in some embodiments, the channels 140 may be parallel to one another, the channels 142 may be parallel to one another, and the channels 140 may be perpendicular to the channels 142. The channels 140 may extend to opposite edges of the first integrated circuit dies 50A perpendicular to longitudinal axes of the channels 140. The channels 140 may be spaced apart from opposite edges of the first integrated circuit dies 50A parallel to the longitudinal axes of the channels 140. The channels 142 may extend to opposite edges of the second integrated circuit dies 50B perpendicular to longitudinal axes of the channels 142. The channels 142 may be spaced apart from opposite edges of the second integrated circuit dies 50B parallel to the longitudinal axes of the channels 142. Although five channels 140 are illustrated as being formed in each of the first integrated circuit dies 50A and two channels 142 are illustrated as being formed in each of the second integrated circuit dies 50B, more or fewer of the channels 140 and the channels 142 may be formed in each of the first integrated circuit dies and the second integrated circuit dies 50B.

In FIG. 8G, channels 140 are provided in backsides of the first integrated circuit dies and the second integrated circuit dies 50B and the encapsulant 124 are free from the channels 140 and the channels 142. The channels 140 may be spaced apart from opposite edges of the first integrated circuit dies 50A perpendicular to longitudinal axes of the channels 140. The channels 140 may also be spaced apart from opposite edges of the first integrated circuit dies 50A parallel to the longitudinal axes of the channels 140. In the embodiment illustrated in FIG. 8G, the channels 140 may have shortened lengths and may be specifically provided over areas of the first integrated circuit dies prone to generating hot spots. As such, the channels 140 may be configured to provide additional cooling to areas adjacent the hot spots, which reduces device defects and improves device performance. Although five channels 140 are illustrated as being formed in each of the first integrated circuit dies 50A, more or fewer of the channels 140 may be formed in each of the first integrated circuit dies 50A.

In FIG. 8H, channels 140 are provided in backsides of the first integrated circuit dies and the encapsulant and channels 142 are provided in backsides of the second integrated circuit dies 50B and the encapsulant 124. The channels 140 and the channels 142 may be parallel to one another. However, in some embodiments, the channels 140 may be parallel to one another, the channels 142 may be parallel to one another, and the channels 140 may be perpendicular to the channels 142. As such, the channels 140 and the channels 142 may form a cross-hash pattern. The channels 140 may extend past opposite edges of the first integrated circuit die 50A to opposite edges of the encapsulant 124 perpendicular to longitudinal axes of the channels 140. The channels 140 may be spaced apart from opposite edges of the first integrated circuit dies 50A parallel to the longitudinal axes of the channels 140. The channels 142 may extend past opposite edges of the second integrated circuit dies 50B to opposite edges of the encapsulant 124 perpendicular to longitudinal axes of the channels 142. The channels 142 may be spaced apart from opposite edges of the second integrated circuit dies 50B parallel to the longitudinal axes of the channels 142. Although five channels 140 are illustrated as being formed in each of the first integrated circuit dies 50A and two channels 142 are illustrated as being formed in each of the second integrated circuit dies 50B, more or fewer of the channels 140 and the channels 142 may be formed in each of the first integrated circuit dies 50A and the second integrated circuit dies 50B.

A cooling cover (such as the cooling cover 200, illustrated in and discussed with reference to FIGS. 1A and 1B) may be subsequently attached to the first integrated circuit dies the second integrated circuit dies 50B, and the encapsulant 124. The cooling cover may be configured to flow a liquid coolant directly across backside surfaces of the first integrated circuit dies 50A, backside surfaces of the second integrated circuit dies 50B, and/or surfaces of the encapsulant 124. The cooling cover may be configured to flow the liquid coolant across the surfaces of the first integrated circuit dies 50A, the second integrated circuit dies 50B, and/or the encapsulant 124 in a direction parallel to or perpendicular with longitudinal axes of the channels 140 and/or the channels 142. Providing the channels 140 and the channels 142 in the backside surfaces of the first integrated circuit dies 50A and/or the second integrated circuit dies 50B improves heat transfer from the first integrated circuit dies 50A and/or the second integrated circuit dies 50B to the liquid coolant. For example, the heat transfer from the first integrated circuit dies and/or the second integrated circuit dies 50B may be greater than about 5 W/mm$^2$, and may be improved from conventional cooling structures by about 60%. This allows for improved device performance and reduced device defects caused by overheating in the first integrated circuit dies and/or the second integrated circuit dies 50B. Providing the channels 140 and/or the channels 142 and flowing the liquid coolant directly adjacent the backsides of the first integrated circuit dies and/or the second integrated circuit dies 50B further allows for other structures, such as thermal interface materials (TIMs), lids, and the like, to be omitted, which reduces costs.

Figure 9:
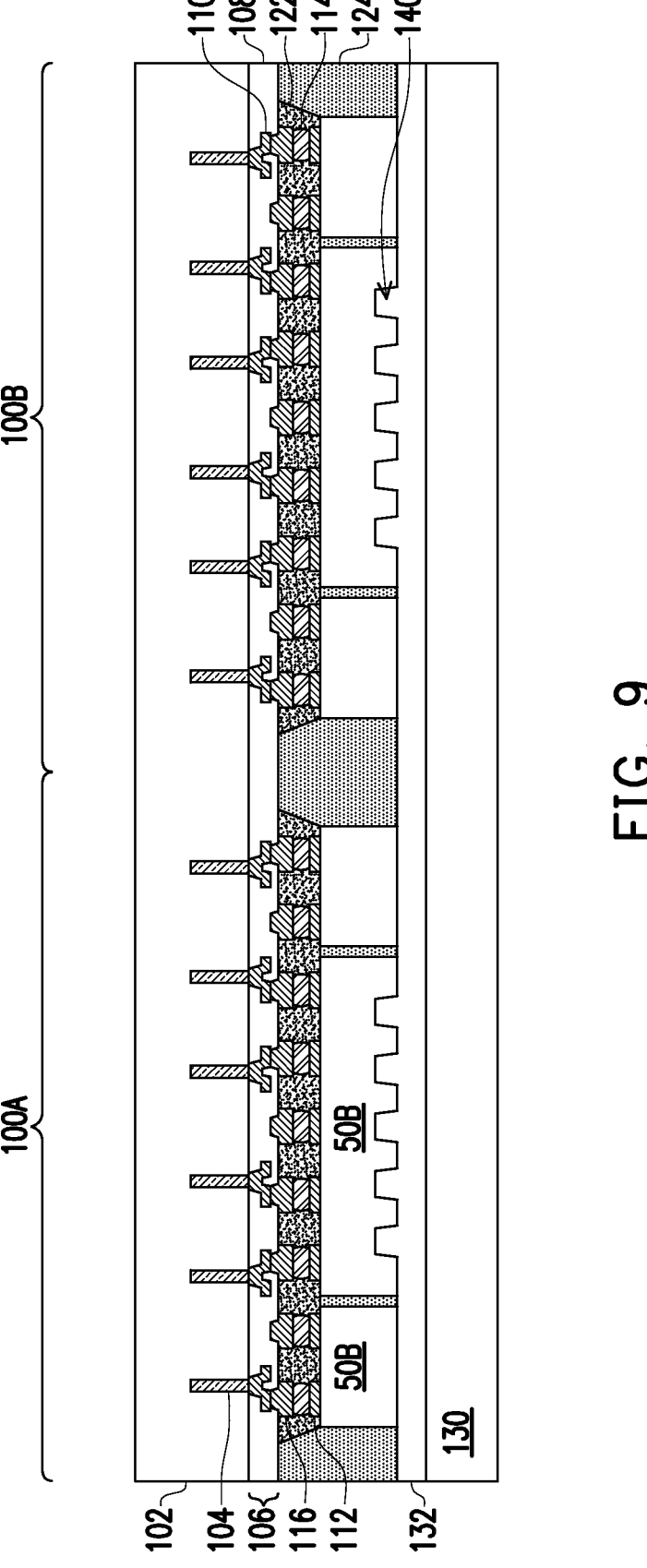

In FIG. 9, a carrier substrate 130 is bonded to the encapsulant 124, the first integrated circuit dies 50A, and the second integrated circuit dies 50B through a release layer 132. The carrier substrate 130 may be a glass carrier substrate, a ceramic carrier substrate, or the like. The carrier substrate 130 may be a wafer, such that multiple packages can be formed on the carrier substrate 130 simultaneously.

The release layer 132 may be formed of a polymer-based material, which may be removed along with the carrier substrate 130 from the overlying structures that will be formed in subsequent steps. In some embodiments, the release layer 132 is an epoxy-based thermal-release material, which loses its adhesive property when heated, such as a light-to-heat-conversion (LTHC) release coating. In some embodiments, the release layer 132 may be an ultra-violet (UV) glue, which loses its adhesive property when exposed to UV lights. The release layer 132 may be dispensed as a liquid and cured, may be a laminate film laminated onto the carrier substrate 130, or may be the like. In some embodiments, the release layer 132 may extend at least partially into the channels 140 and/or the channels 142; however, in some embodiments, the channels 140 and/or the channels 142 may be free from the release layer 132. The top surface of the release layer 132 may be leveled and may have a high degree of planarity. Further in FIG. 9, after the carrier substrate 130 is bonded to the encapsulant 124, the first integrated circuit dies 50A, and the second integrated circuit dies 50B, the device may be flipped such that a backside of the substrate 102 faces upwards.

Figure 10:
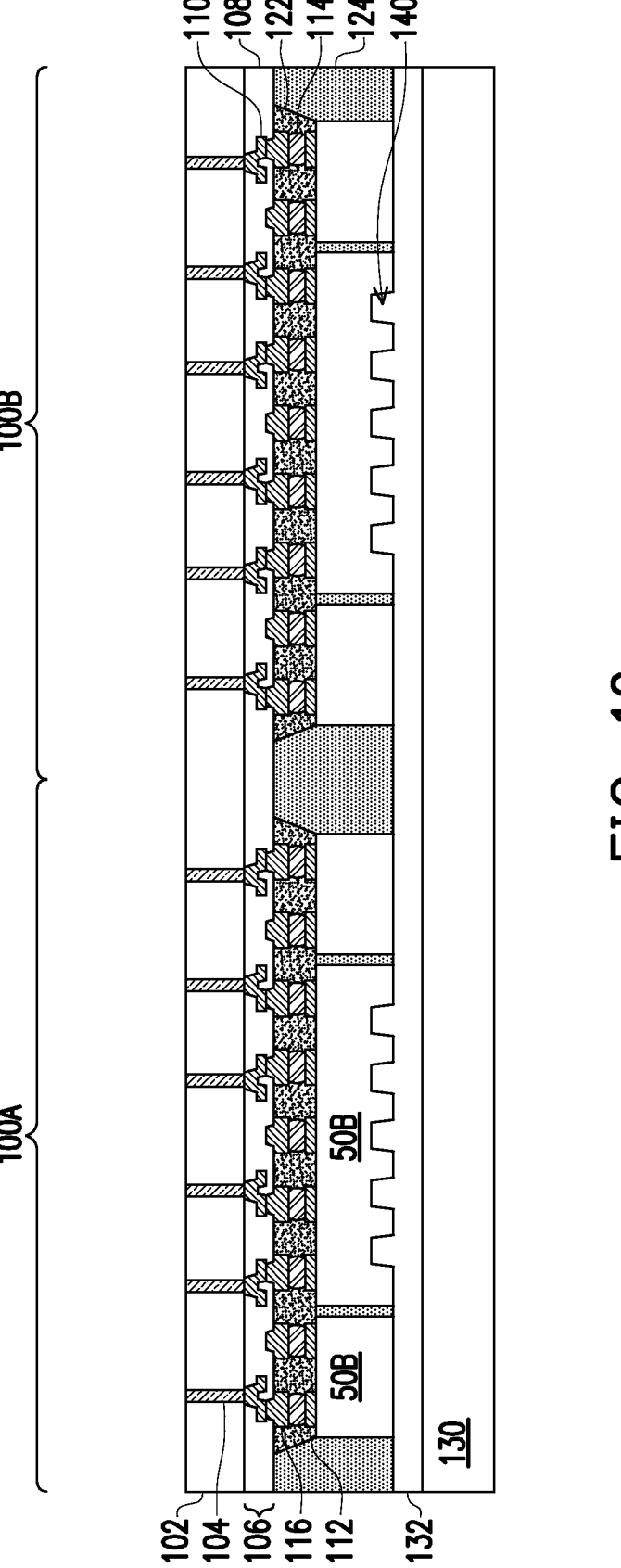

In FIG. 10, the substrate 102 is thinned. The thinning may be by a CMP process, a grinding process, an etch-back process, a combination thereof, or the like. The thinning is performed on the backside surface of the substrate 102. The thinning exposes the conductive vias 104. After the thinning, surfaces of the conductive vias 104 and the backside surface of the substrate 102 are coplanar (e.g., level) within process variations. The exposed conductive vias 104 may be referred to as through substrate vias or through silicon vias (TSVs). After the substrate 102 is thinned, the conductive vias 104 may provide electrical connections through the substrate 102.

Figure 11:
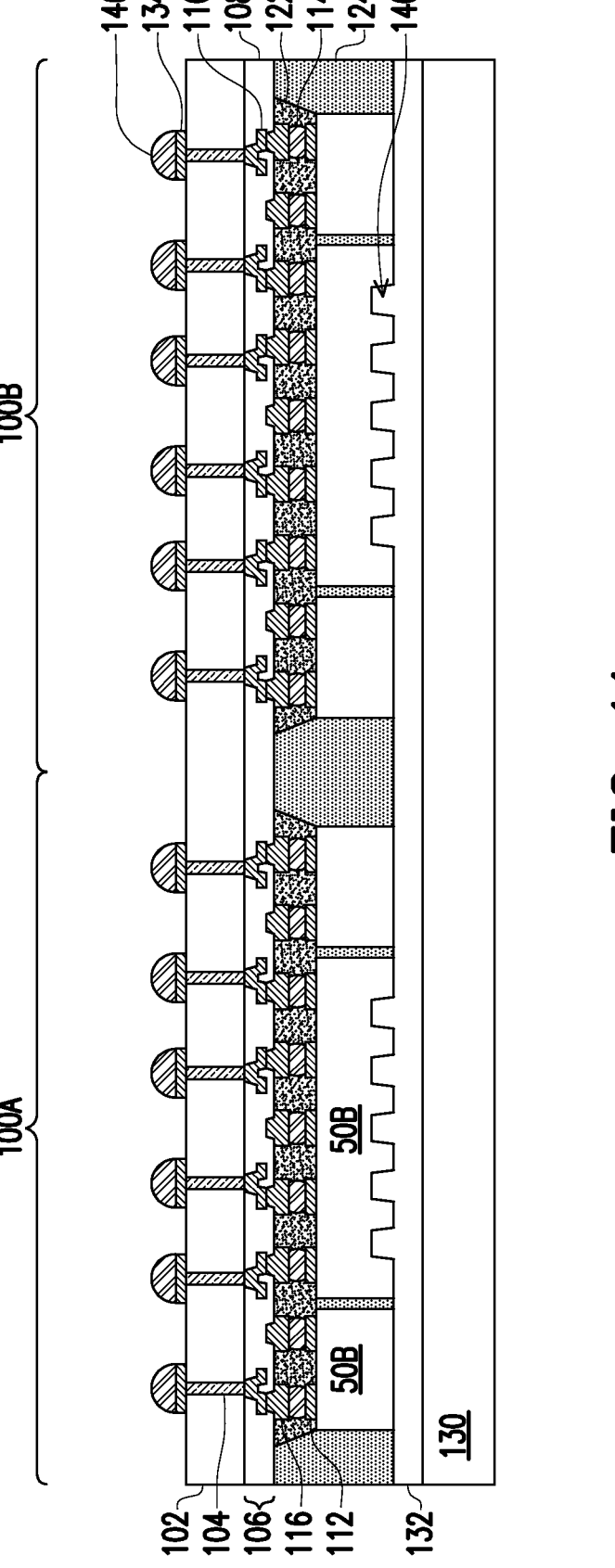

In FIG. 11, die connectors 134 are formed at the backside of the substrate 102 and conductive connectors 146 are formed on the die connectors 134. The die connectors 134 may be in physical contact with and electrically coupled to the conductive vias 104. The die connectors 134 may be conductive pillars, pads, or the like, to which external connections are made. The die connectors 134 can be formed of a metal, such as copper, aluminum, or the like, and can be formed by, for example, plating, or the like. The die connectors 134 are electrically connected to devices formed in the substrate 102 and the interconnect structure 106.

The conductive connectors 146 may be ball grid array (BGA) connectors, solder balls, metal pillars, controlled collapse chip connection (C4) bumps, micro bumps, electroless nickel-electroless palladium-immersion gold technique (ENEPIG)-formed bumps, or the like. The conductive connectors 146 may include a conductive material such as solder, copper, aluminum, gold, nickel, silver, palladium, tin, the like, or a combination thereof. In some embodiments, the conductive connectors 146 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 146 comprise metal pillars (such as copper pillars) formed by sputtering, printing, electroplating, electroless plating, CVD, or the like. In embodiments in which the conductive connectors comprise metal pillars, the metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 12:
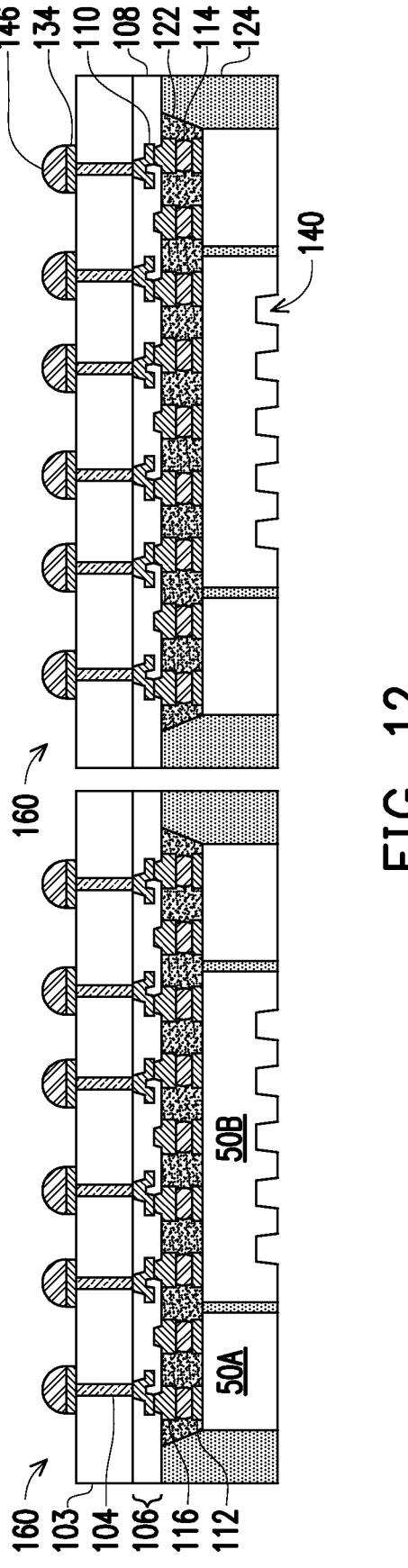

In FIG. 12, a singulation process is performed by sawing along scribe line regions. For example, the singulation process may be performed by sawing along scribe line region between the package regions 100A-100D (see FIG. 8B). The sawing singulates individual integrated circuit packages 160 from one another. The resulting, singulated integrated circuit packages 160 may be from any of the package regions 100A-100D. The singulation process singulates the substrate 102 of the wafer 100 to form a plurality of substrates 103. The singulation process may also saw through the encapsulant 124 and the interconnect structure 106. Each of the integrated circuit packages 160 may include a singulated portion of the wafer 100 (e.g., a substrate 103), and the integrated circuit dies 50 that are bonded to the singulated portion of the wafer 100.

Further in FIG. 12, a carrier substrate de-bonding is performed to detach (or "de-bond") the carrier substrate 130 from the encapsulant 124, the first integrated circuit dies 50A, and the second integrated circuit dies 50B. In some embodiments, the de-bonding includes projecting a light, such as a laser light or an UV light, on the release layer 132 so that the release layer 132 decomposes under the heat of the light and the carrier substrate 130 can be removed. The carrier substrate de-bonding may be performed before or after the singulation process is performed.

Figure 13:
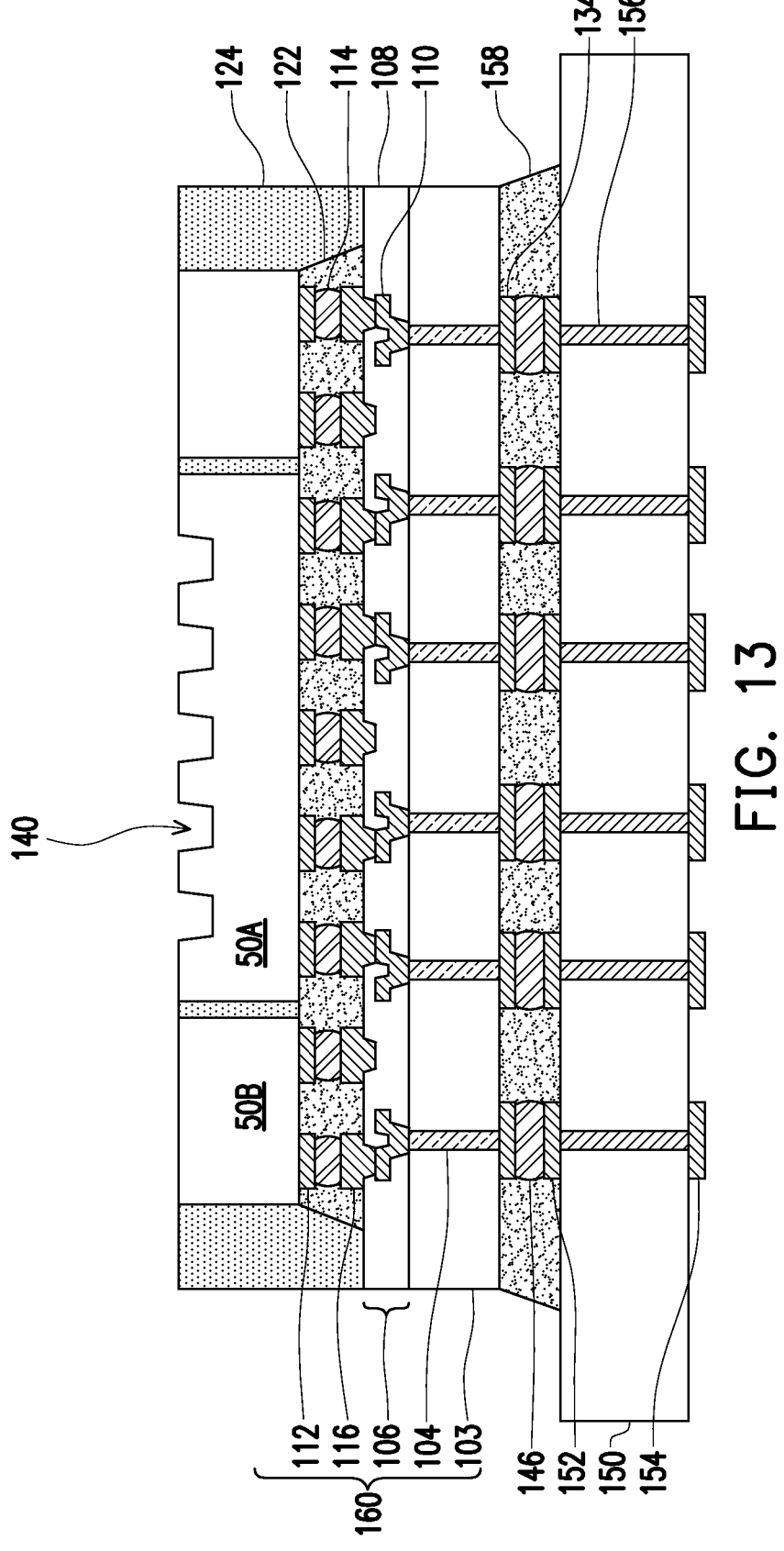

In FIG. 13, a substrate 150 is coupled to each of the integrated circuit packages 160. The substrate 150 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 150 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. In some embodiments, the substrate 150 may be based on an insulating core such as a fiberglass reinforced resin core. In some embodiments, the core material may be a fiberglass resin such as FR4. In some embodiments, the core material may include bismaleimide-triazine (BT) resin, other printed circuit board (PCB) materials, or other films. Build up films such as Ajinomoto build-up film (ABF) or other laminates may be used for the substrate 150.

The substrate 150 may include active and passive devices (not separately illustrated). A wide variety of devices such as transistors, capacitors, resistors, combinations of these, and the like may be included. The devices may be formed using any suitable methods. The substrate 150 may also include metallization layers (not separately illustrated) and conductive vias 156. The metallization layers may be formed over the active and passive devices and are designed to connect the various devices to form functional circuitry. The metallization layers may be formed of alternating layers of dielectric materials (e.g., low-k dielectric materials) and conductive materials (e.g., copper) with vias interconnecting the layers of conductive materials. The metallization layers may be formed through any suitable processes (such as deposition, damascene, dual damascene, or the like). In some embodiments, the substrate 150 is substantially free of active and passive devices.

The substrate 150 may include bond pads 152 formed on a first side of the substrate 150 and bond pads 154 on a second side of the substrate 150 opposite the first side of the substrate 150. The bond pads 152 may be coupled to the conductive connectors 146. In some embodiments, the bond pads 152 and the bond pads 154 may be formed by forming recesses (not separately illustrated) into dielectric layers (not separately illustrated) on the first and second sides of the substrate 150. The recesses may be formed to allow the bond pads 152 and the bond pads 154 to be embedded into the dielectric layers. In some embodiments, the recesses are omitted and the bond pads 152 and the bond pads 154 may be formed on the dielectric layers. In some embodiments, the bond pads 152 and the bond pads 154 include a thin seed layer (not separately illustrated) made of copper, titanium, nickel, gold, palladium, the like, or a combination thereof. The conductive materials of the bond pads 152 and the bond pads 154 may be deposited over the thin seed layer. The conductive materials may be formed by an electro-chemical plating process, an electroless plating process, CVD, ALD, PVD, the like, or a combination thereof. In an embodiment, the conductive materials of the bond pads 152 and the bond pads 154 include copper, tungsten, aluminum, silver, gold, the like, or a combination thereof.

In some embodiments, the bond pads 152 and the bond pads 154 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 152 and the bond pads 154. Any suitable materials or layers of materials that may be used for the bond pads 152 and the bond pads 154 are fully intended to be included within the scope of the current application. In some embodiments, the conductive vias 156 extend through the substrate 150 and couple at least one of the bond pads 152 to at least one of the bond pads 154.

The substrate 150 may be mechanically and electrically bonded to the integrated circuit package 160 by way of the bond pads 152, the conductive connectors 146, and the die connectors 134. The substrate 150 may be placed over the integrated circuit package 160 and a reflow process may be performed to reflow the conductive connectors 146 and bond the bond pads 152 to the die connectors 134 through the conductive connectors 146.

An underfill 158 may be formed between the integrated circuit package 160 and the substrate 150, surrounding the bond pads 152, the die connectors 134, and the conductive connectors 146. The underfill 158 may reduce stress and protect the joints resulting from the reflowing of the conductive connectors 146. The underfill 158 may be formed by a capillary flow process after the substrate 150 is attached to the integrated circuit package 160, or may be formed by a suitable deposition method before the substrate 150 is attached.

In FIGS. 14A through 14D, a cooling cover 200 is attached to the integrated circuit package 160 and the underlying substrate 150, in accordance with some embodiments. In the embodiments illustrated in FIGS. 14A and 14D, the cooling cover 200 is attached to the integrated circuit package 160 and the underlying substrate 150 by screw-type fasteners 170. In the embodiment illustrated in FIG. 14B, the cooling cover 200 is attached to the integrated circuit package 160 by an adhesive 226. In the embodiment illustrated in FIG. 14C, the cooling cover 200 is attached to the integrated circuit package 160 and the substrate 150 by one or more clamp-type fasteners 180.

Figure 14A:
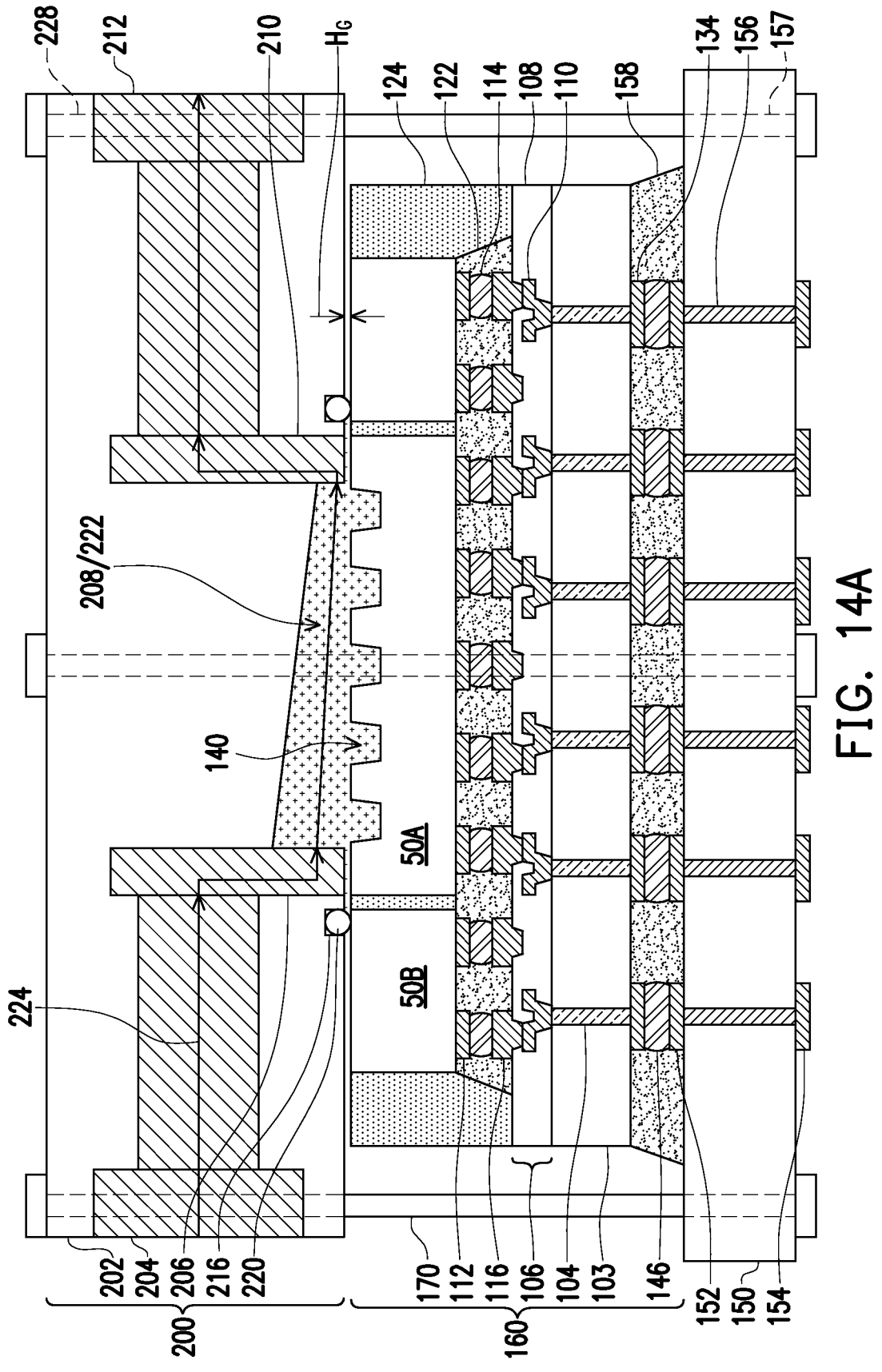
FIGS. 14A through 14D illustrate cross-sectional views of package structures including cooling covers, in accordance with some embodiments.
Figure 14B:
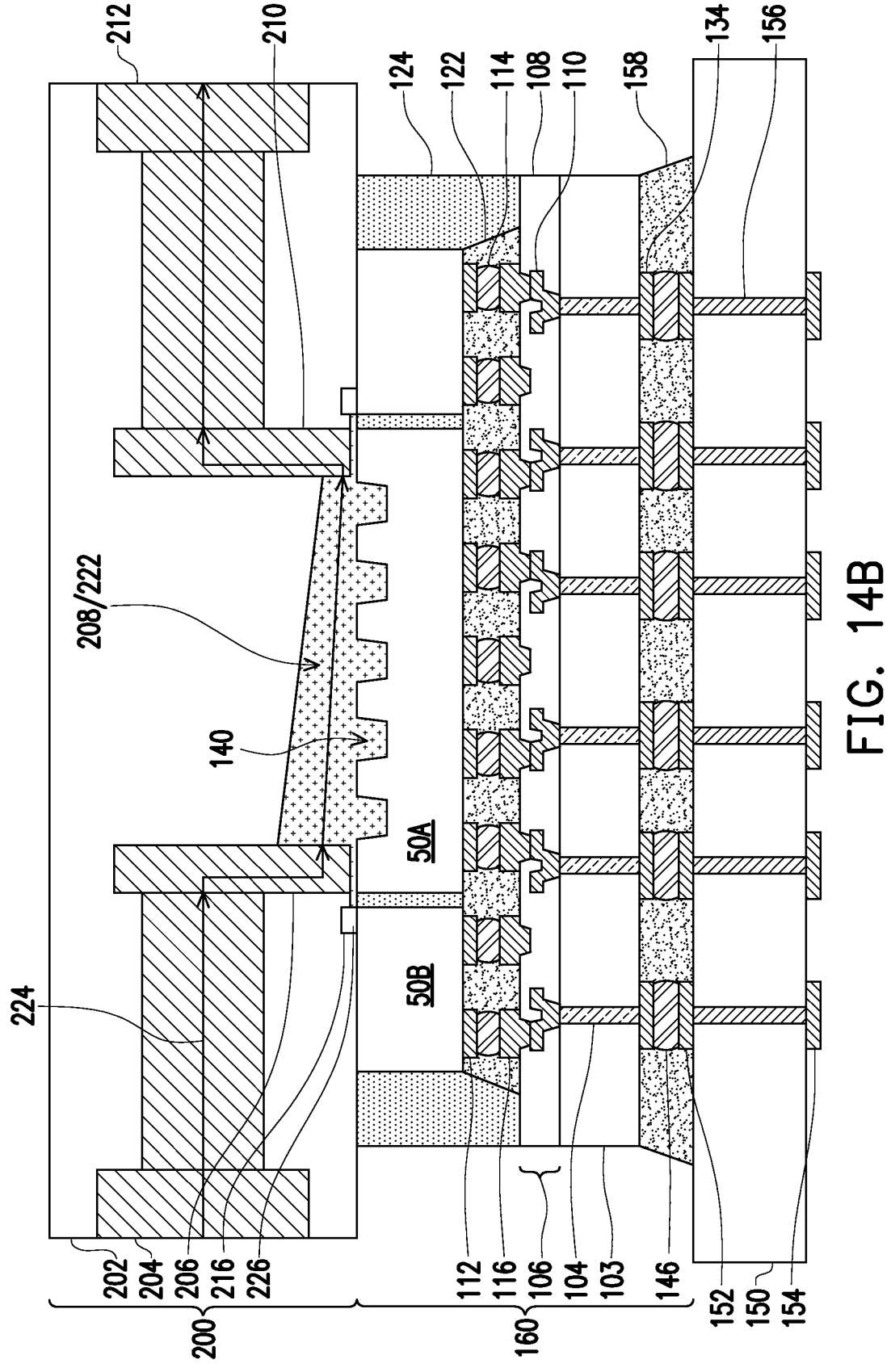
Figure 14C:
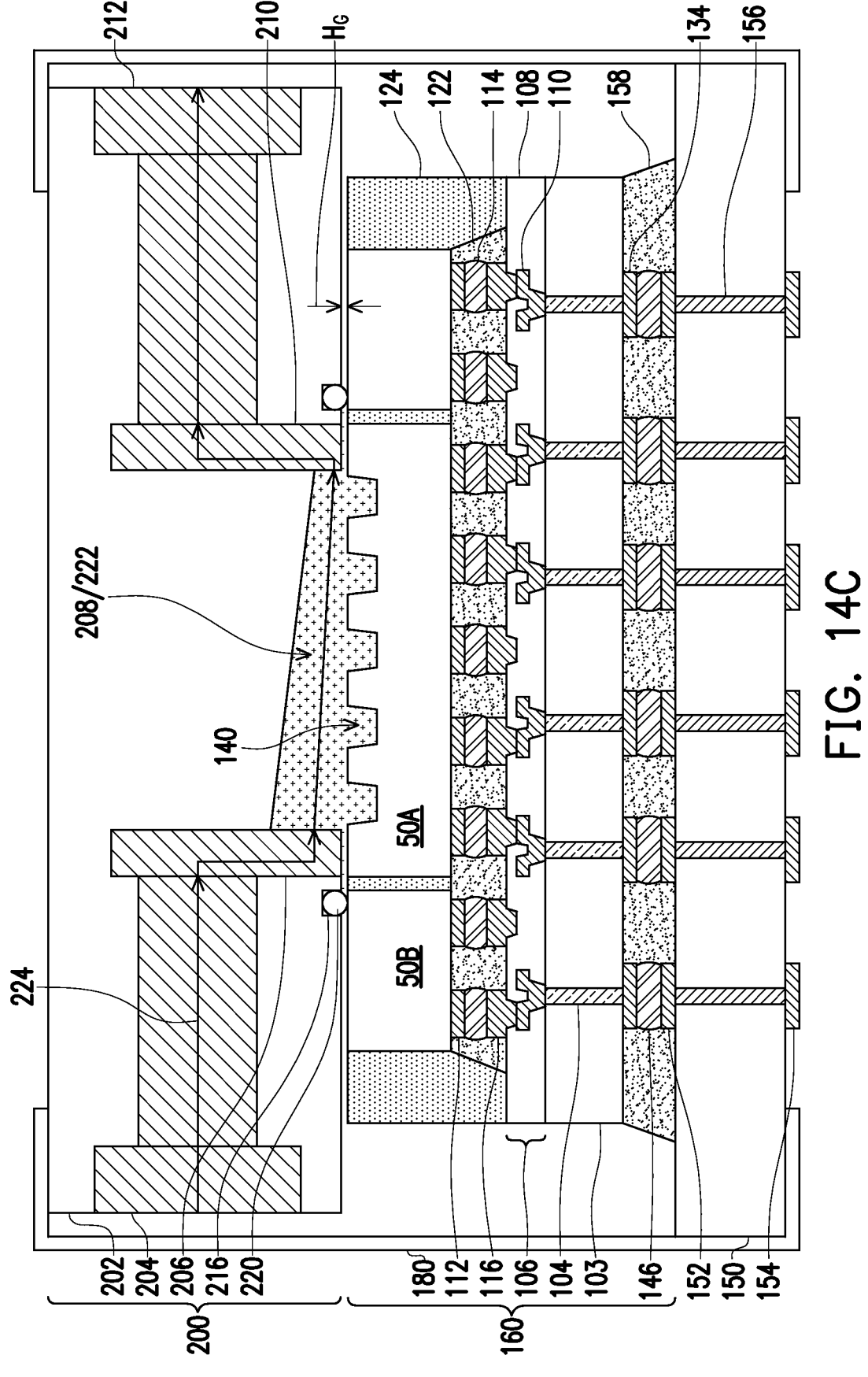
Figure 14D:
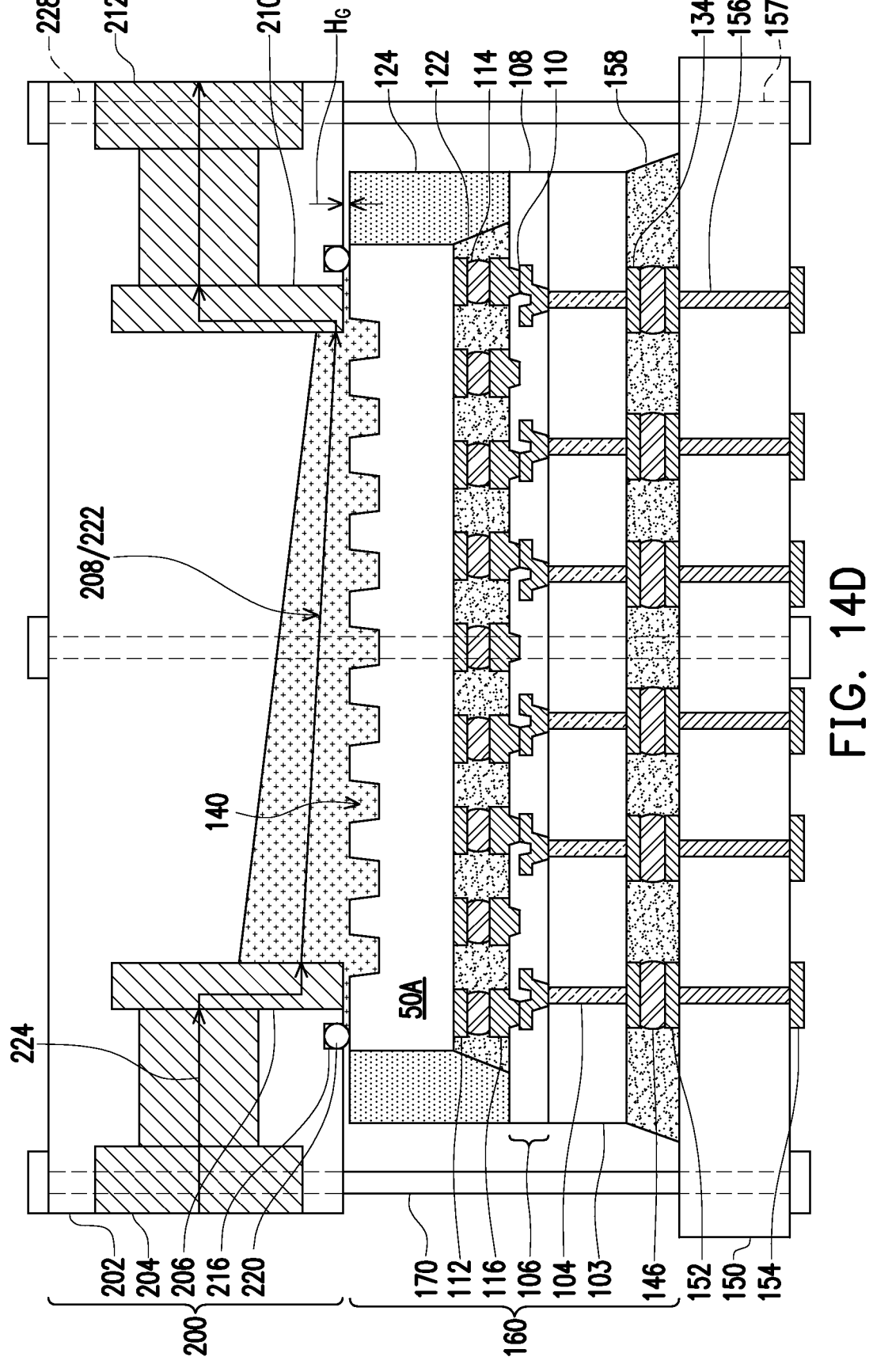

In the embodiment illustrated in FIGS. 14A and 14D, the cooling cover 200 is attached to the integrated circuit package 160 and the substrate 150 by the screw-type fasteners 170. The screw-type fasteners 170 may include bolts, which extend through the bolt holes 228 in the cover body 202 and bolt holes 157 in the substrate 150. In some embodiments, such as the embodiment illustrated in FIG. 1A, six of the bolt holes 228 may be provided in the cover body 202 and six of the bolt holes 157 may be provided in the substrate 150; however, a greater or fewer number of the bolt holes 228/157 may be provided. The screw-type fasteners 170 may further include fasteners that are threaded onto the bolts and tightened to clamp the cooling cover 200 onto the integrated circuit package 160. In some embodiments, the fasteners may be nuts that thread to the bolts.

In the embodiment illustrated in FIG. 14B, the cooling cover 200 is attached to the integrated circuit package 160 by the adhesive 226. The adhesive 226 may be a thermal interface material (TIM) or other suitable adhesive. In some embodiments, the adhesive 226 may include any suitable adhesives, epoxies, die attach films (DAFs), or the like. The adhesive 226 may be applied in the channel 216, a pressure may be applied between the cooling cover and the semiconductor device, and the adhesive 226 may be cured.

In the embodiment illustrated in FIG. 14C, the cooling cover 200 is attached to the integrated circuit package 160 and the substrate 150 by the clamp-type fasteners 180. The clamp-type fasteners 180 may be similar to the screw-type fasteners 170. For example, the clamp-type fasteners 180 may include threaded portions, such as bolts, and fasteners that are threaded onto the bolts and tightened to clamp the cooling cover 200 onto the integrated circuit package 160. The fasteners may include nuts that thread onto the bolts. The clamp-type fasteners 180 may be fastened onto the exteriors of the cooling cover 200 and the substrate 150, such that bolt holes are not formed in the cooling cover 200 and the substrate 150. At least portions of the clamp-type fasteners 180 may be disposed outside of peripheries of the cooling cover 200 and the substrate 150. The clamp-type fasteners may contact a surface of the cooling cover 200 opposite the substrate 150 and a surface of the substrate 150 opposite the cooling cover 200. Two clamp-type fasteners 180 are illustrated as being attached on opposite sides of the cooling cover 200, the integrated circuit package 160, and the substrate 150 in FIG. 14C; however, in some embodiments the clamp-type fasteners 180 on opposite sides of the cooling cover 200, the integrated circuit package 160, and the substrate 150 may be continuous, or any number of clamp-type fasteners 180 may be used to attach the cooling cover 200 to the integrated circuit package 160 and the substrate 150.

In embodiments in which the cooling cover 200 is attached to the integrated circuit package 160 and the substrate 150 using the screw-type fasteners 170 or the clamp-type fasteners 180, the gasket 220 may be provided in the channel 216 to seal the cooling chamber 208 between the cover body 202 and the integrated circuit package 160. As illustrated in FIGS. 14A, 14C, and 14D, a gap may be present between the cooling cover 200 and the integrated circuit package 160, and the gasket 220 may be used to seal the gap. The gap may have a gap height $H_G$ in a range from about 0 µm to about 5000 µm. Attaching the cooling cover 200 with the prescribed gap height $H_G$ ensures that the gasket 220 is able to seal the cooling chamber 208, which prevents a liquid coolant 222 from escaping the cooling chamber 208. Further, provided gap heights $H_G$ larger than prescribed reduces the ratio between the inlet height $H_I$ and the outlet height $H_O$, which reduces the improved evenness of heat transfer from the integrated circuit package 160 to the liquid coolant 222.

FIG. 14D illustrates an embodiment in the cooling cover 200 is attached to a integrated circuit package 160i including a single first integrated circuit die 50A and no second integrated circuit dies 50B. The first integrated circuit die 50A may be laterally encapsulated by an encapsulant 124, as illustrated in FIG. 14D, or the encapsulant 124 may be omitted. The cooling cover 200 may be attached to a integrated circuit package 160 including any number of first integrated circuit dies 50A and/or second integrated circuit dies 50B.

FIGS. 14A through 14D further illustrate a flow path 224 of a liquid coolant 222 through the cooling cover 200. The flow path 224 extends through the inlet 204, spreads through the inlet distributor 206, flows through the cooling chamber 208 across surfaces of the integrated circuit package 160, condenses through the outlet collector 210, and out through the outlet 212. As discussed previously, the height of the cooling chamber 208 decreases in the direction of the flow path 224, such that the flowrate (e.g., the mass flux) of the liquid coolant 222 increases as the liquid coolant 222 moves through the cooling chamber 208. As the liquid coolant 222 flows through the cooling chamber 208, the temperature of the liquid coolant 222 increases, which reduces heat transfer from the integrated circuit package 160 to the liquid coolant 222. However, increasing the flowrate of the liquid coolant 222 increases heat transfer from the integrated circuit package 160 to the liquid coolant 222. As such, forming the cooling chamber 208 with the prescribed heights and shape ensures that heat transfer from the integrated circuit package 160 to the liquid coolant 222 is even across the flow path 224 through the cooling chamber 208. This allows for improved device performance and reduced device defects caused by overheating in the integrated circuit package 160.

FIGS. 14A through 14D illustrate embodiments in which the cooling chamber 208 is provided over the first integrated circuit die 50A. In some embodiments, the cooling chamber 208 may extend over the first integrated circuit die 50A, the second integrated circuit dies 50B, the encapsulant 124, or any combination thereof. Further, FIGS. 14A through 14D illustrate an embodiment in which a flow direction of the flow path 224 of the liquid coolant 222 over the first integrated circuit die 50A is perpendicular to longitudinal axes of the channels 140. However, in some embodiments, the flow direction of the flow path 224 of the liquid coolant 222 over the first integrated circuit die 50A, the second integrated circuit dies 50B, and/or the encapsulant 124 may be parallel to or perpendicular to longitudinal axes of the channels 140 and/or the channels 142. Selection of the flowrate of the liquid coolant 222 and the flow direction of the liquid coolant 222 along the flow path 224 impacts the heat transfer from the integrated circuit package 160 to the liquid coolant 222 and may be used to meet heat transformation for the devices included in the integrated circuit package 160.

Embodiments may achieve various advantages. For example, providing the cooling cover 200 including a cooling chamber 208, which has a decreasing height from an inlet to an outlet increases a flowrate of a liquid coolant 222 as the liquid coolant 222 flows across the cooling chamber 208. This makes heat transfer from a integrated circuit package 160 to the liquid coolant 222 more even and improves heat transfer from the integrated circuit package 160 to the liquid coolant 222. This allows for improved device performance and reduced device defects caused by overheating in the integrated circuit package 160.

In accordance with an embodiment, a cooling cover for a semiconductor device includes an inlet; an outlet; and a cooling chamber in fluid communication with the inlet and the outlet, the cooling chamber having a trapezoidal shape in a cross-sectional view. In an embodiment, the cooling chamber has a first height adjacent the inlet, the cooling chamber has a second height adjacent the outlet, and the first height is greater than the second height. In an embodiment, a ratio of the first height to the second height is from 1 to 50. In an embodiment, the first height is less than 2000 $\mu$m, and the second height is less than 1000 $\mu$m. In an embodiment, the cooling cover further includes an adhesive encircling the cooling chamber. In an embodiment, the cooling cover further includes a gasket encircling the cooling chamber. In an embodiment, the cooling chamber is configured to directly cool a backside of an integrated circuit device using a liquid coolant.

In accordance with another embodiment, an apparatus includes a packaged semiconductor device, the packaged semiconductor device including a first integrated circuit chip, the first integrated circuit chip including a plurality of channels on a backside of the first integrated circuit chip; and a cooling cover on the packaged semiconductor device, the cooling cover including a cooling chamber on the first integrated circuit chip; and a gasket surrounding the cooling chamber and contacting the packaged semiconductor device. In an embodiment, the cooling cover is attached to the packaged semiconductor device by a screw-type fastener, the screw-type fastener extending through a portion of the packaged semiconductor device and a portion of the cooling cover. In an embodiment, the cooling cover is attached to the packaged semiconductor device by a clamp-type fastener, the clamp-type fastener contacting a first surface of the cooling cover opposite the packaged semiconductor device and a second surface of the packaged semiconductor device opposite the cooling cover. In an embodiment, the cooling cover further includes an inlet and an outlet, the cooling chamber is in fluid communication with the inlet and the outlet, and the cooling chamber has a trapezoidal shape in a cross-sectional view. In an embodiment, the cooling chamber has a first height adjacent the inlet, the cooling chamber has a second height adjacent the outlet, the first height is less than 2000 $\mu$m, and the second height is less than 1000 $\mu$m. In an embodiment, the cooling chamber is configured to flow a liquid coolant across the plurality of channels in a direction perpendicular to longitudinal axes of the plurality of channels. In an embodiment, the cooling chamber is configured to flow a liquid coolant across the plurality of channels with an increasing mass flux.

In accordance with yet another embodiment, a method of cooling a packaged semiconductor device includes providing a packaged semiconductor device; attaching a cooling cover to the packaged semiconductor device; and flowing a liquid coolant through the cooling cover, the cooling cover being configured to increase a flowrate of the liquid coolant as the liquid coolant moves across a surface of the packaged semiconductor device. In an embodiment, the surface of the packaged semiconductor device is provided with a plurality of channels formed therein. In an embodiment, the liquid coolant includes water. In an embodiment, the cooling cover is attached to the packaged semiconductor device by an adhesive, and the adhesive is placed in a channel encircling a cooling chamber of the cooling cover. In an embodiment, the cooling cover is attached to the packaged semiconductor device by screw-type fasteners, and the screw-type fasteners apply pressure to a gasket encircling a cooling chamber of the cooling cover to prevent the liquid coolant from escaping the cooling chamber. In an embodiment, the cooling cover includes a cooling chamber on the packaged semiconductor device, the cooling chamber having a sloped surface opposite the packaged semiconductor device, the sloped surface of the cooling chamber increasing the flowrate of the liquid coolant as the liquid coolant moves across the sloped surface of the cooling chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cooling cover comprising:
   a base having a major surface extending in a first plane, the major surface being configured to thermally connect to a semiconductor device;
   an inlet, the inlet having a first fluid-flow cross-sectional area and having a first flow-path height extending in a first direction perpendicular to the first plane;
   an inlet distributor in fluid communication with the inlet, the inlet distributor having a second fluid-flow cross-sectional area greater than the first fluid-flow cross-sectional area and having a second flow-path height greater than the first flow-path height in the first direction;
   an outlet;
   an outlet collector in fluid communication with the outlet; and
   a cooling chamber having a first side in fluid communication with the inlet distributor, the cooling chamber having a trapezoidal shape in a cross-sectional view, wherein the cooling chamber has a third flow-path height less than the second flow-path height in the first direction at an interface between the cooling chamber and the inlet distributor and has a fourth flow-path height less than the third flow-path height in the first direction at a second interface between the cooling chamber and the outlet collector, and further wherein the cooling chamber has a third fluid-flow cross-sectional area less than the second fluid-flow cross-sectional area at the second interface, and further wherein the outlet collector has a fifth flow-path height greater than the fourth flow-path height in the first direction and greater than a sixth flow-path height of the outlet in the first direction; and wherein the outlet has a fourth fluid-flow cross-sectional area less than the third fluid-flow cross-sectional area.

2. The cooling cover of claim 1, wherein the cooling chamber has a first height adjacent the inlet, wherein the cooling chamber has a second height adjacent the outlet, and wherein the first height is greater than the second height.

3. The cooling cover of claim 2, wherein a ratio of the first height to the second height is from 1 to 50.

4. The cooling cover of claim 2, wherein the first height is less than 2000 μm, and wherein the second height is less than 1000 μm.

5. The cooling cover of claim 1, further comprising an adhesive encircling the cooling chamber.

6. The cooling cover of claim 1, wherein the cooling cover includes a groove encircling the cooling chamber, and further comprising a gasket within the groove.

7. The cooling cover of claim 1, wherein the cooling chamber is configured to directly cool a backside of an integrated circuit device using a liquid coolant.

8. An apparatus comprising:

a packaged semiconductor device, the packaged semiconductor device comprising a first integrated circuit chip, the first integrated circuit chip comprising a plurality of channels on a backside of the first integrated circuit chip; and a cooling cover on the packaged semiconductor device, wherein the cooling cover comprises:

a fluid inlet having a first fluid-flow cross-sectional area and a first flow-path height extending in a first direction perpendicular to a major surface of the packaged semiconductor device;

an inlet distributor having a second fluid flow cross-section area and having a second flow-path height in the first direction, greater than the first flow-path height;

a cooling chamber on the first integrated circuit chip, a first side of the cooling chamber having a third flow-path height less than the second flow-path height and being in fluid communication with the inlet distributor;

an outlet collector having a fourth flow-path height greater than the third flow-path height, wherein a second side of the cooling chamber, opposite the first side of the cooling chamber, has a third fluid-flow cross-sectional area less than the second fluid flow cross-sectional area and is in fluid communication with the outlet collector;

an outlet in fluid communication with the outlet collector, the outlet having a fourth fluid-flow cross-sectional area less than the third fluid-flow cross-sectional area, and having a fifth flow-path height less than the fourth flow-path height; and a gasket surrounding the cooling chamber and contacting the packaged semiconductor device.

9. The apparatus of claim 8, wherein the cooling cover is attached to the packaged semiconductor device by a screw-type fastener, wherein the screw-type fastener extends through a portion of the packaged semiconductor device and a portion of the cooling cover.

10. The apparatus of claim 8, wherein the cooling cover is attached to the packaged semiconductor device by a clamp-type fastener, the clamp-type fastener contacting a first surface of the cooling cover opposite the packaged semiconductor device and a second surface of the packaged semiconductor device opposite the cooling cover.

11. The apparatus of claim 8, wherein the cooling cover further comprises an inlet and an outlet, wherein the cooling chamber is in fluid communication with the inlet and the outlet, and wherein the cooling chamber has a trapezoidal shape in a cross-sectional view.

12. The apparatus of claim 11, wherein the cooling chamber has a first height adjacent the inlet, wherein the cooling chamber has a second height adjacent the outlet, wherein the first height is less than 2000 μm, and wherein the second height is less than 1000 μm.

13. The apparatus of claim 8, wherein the cooling chamber is configured to flow a liquid coolant across the plurality of channels in a direction perpendicular to longitudinal axes of the plurality of channels.

14. The apparatus of claim 8, wherein the cooling chamber is configured to flow a liquid coolant across the plurality of channels with an increasing mass flux.

15. A method of cooling a packaged semiconductor device comprising:

providing a packaged semiconductor device;

attaching a mating surfaced of a cooling cover to the packaged semiconductor device by passing a screw assembly through a bolt hole in the cooling cover and a corresponding bolt hole in the packaged semiconductor device; and flowing a liquid coolant through the cooling cover by flowing the liquid coolant through an inlet having a first flow-path height, measured in a first direction perpendicular to the mating surface, and having a first fluid-flow cross-sectional area, flowing the liquid coolant from the inlet to an inlet distributor having a second flow-path height, greater than the first flow-path height in the first direction, and having a second fluid-flow cross-sectional area less, flowing the liquid coolant from the inlet distributor to a cooling chamber having a cooling chamber flow-path height that decreases in the direction of the liquid coolant flow from a third flow-path height to a fourth flow-path height less than the third flow-path height, the cooling chamber further having a fluid-flow cross-sectional area that decreases in the direction of the liquid coolant flow to a third fluid-flow cross-sectional area less than the second fluid-flow cross-sectional area, flowing the liquid coolant from the cooling chamber to an outlet collector having a fifth flow-path height greater than the third flow-path height, and flowing the liquid coolant from the outlet collector to an outlet having a fourth fluid-flow cross-sectional area, less than the third fluid-flow cross-sectional area, and further having a sixth flow-path height less than the fifth flow-path height.

16. The method of claim 15, wherein the surface of the packaged semiconductor device is provided with a plurality of channels formed therein.

17. The method of claim 15, wherein the liquid coolant comprises water.

18. The method of claim 15, wherein the cooling cover is attached to the packaged semiconductor device by an adhesive, and wherein the adhesive is placed in a channel encircling a cooling chamber of the cooling cover.

19. The method of claim 15, wherein the cooling cover is attached to the packaged semiconductor device by screw-type fasteners, and wherein the screw-type fasteners apply pressure to a gasket encircling a cooling chamber of the cooling cover to prevent the liquid coolant from escaping the cooling chamber.

20. The method of claim 15, wherein the cooling cover comprises a cooling chamber on the packaged semiconductor device, wherein the cooling chamber has a sloped surface opposite the packaged semiconductor device, wherein the sloped surface of the cooling chamber increases the flowrate of the liquid coolant as the liquid coolant moves across the sloped surface of the cooling chamber.

\*　\*　\*　\*　\*